(12) United States Patent
Lo

(10) Patent No.: US 6,806,114 B1
(45) Date of Patent: Oct. 19, 2004

(54) BROADLY TUNABLE DISTRIBUTED BRAGG REFLECTOR STRUCTURE PROCESSING

(75) Inventor: Yu-Hwa Lo, San Diego, CA (US)

(73) Assignee: Nova Crystals, Inc., San Jose, CA (US)

( * ) Notice: Subject to any disclaimer, the term of this patent is extended or adjusted under 35 U.S.C. 154(b) by 146 days.

(21) Appl. No.: 10/039,526

(22) Filed: Nov. 7, 2001

(51) Int. Cl.⁷ .............................. H01L 21/00; H01S 5/00
(52) U.S. Cl. ........................................... 438/36; 372/46
(58) Field of Search ....................... 438/35–36; 372/96, 372/99, 43–50

(56) References Cited

U.S. PATENT DOCUMENTS

| | | | | |
|---|---|---|---|---|
| 5,699,375 A | * | 12/1997 | Paoli ............................ | 372/50 |
| 5,789,274 A | * | 8/1998 | Yamaguchi et al. ........... | 438/32 |
| 6,191,431 B1 | * | 2/2001 | Hoof et al. .................... | 257/17 |
| 6,353,624 B1 | * | 3/2002 | Pelekanos et al. ............. | 372/45 |
| 6,459,709 B1 | * | 10/2002 | Lo et al. ........................ | 372/20 |

\* cited by examiner

Primary Examiner—Alexander Ghyka
Assistant Examiner—Viktor Simkovic
(74) Attorney, Agent, or Firm—Fernandez & Associates LLP

(57) ABSTRACT

A process for creating a broadly tunable Distributed Bragg Reflector (DBR) with a reduced recombination rate. According to the current invention, this may be achieved by creating electron confinement regions and hole confinement regions in the waveguide of the DBR. Preferably, this is achieved by engineering the band gaps of the DBR waveguide and cladding materials. Preferably, the materials selected for use in the DBR may be lattice matched. Alternately, two or more thin electron confinement regions and two or more thin hole confinement regions may be created to take advantage of strain compensation in thinner layers thereby broadening the choices of materials appropriate for use in creating a broadly tunable DBR. Alternately, graded materials and/or graded interfaces may be created according to alternate processes according to the current invention to provide effective electron and/or hole confinement regions in various DBR designs.

36 Claims, 23 Drawing Sheets

A = electron confinement layer
B = hole confinement layer

Create a first cladding layer (Step 910).

Create a grating layer (Step 920).

Create a hole confinement region layer (Step 930).

Create an electron confinement region layer (Step 940).

Create a second cladding layer (Step 950).

(Optional) Pattern laser structure and additional device processing (Step 960).

BROADLY TUNABLE DISTRIBUTED BRAGG REFLECTOR STRUCTURE PROCESSING

CROSS REFERENCE TO RELATED APPLICATIONS

This application relates to concurrently filed, co-pending application U.S. patent application Ser. No. 09/849,109, entitled "Vertical-Cavity Surface Emitting Laser (VCSEL) Structure and Method for a Wavelength Tunable Laser" by Yu-Hwa Lo et al., owned by the assignee of this application and incorporated herein by reference.

This application relates to concurrently filed, co-pending application U.S. patent application Ser. No. 09/849,958, entitled "Distributed Feedback (DFB) Structure and Method for a Wavelength Tunable Laser" by Yu-Hwa Lo et al., owned by the assignee of this application and incorporated herein by reference.

This application relates to concurrently filed, co-pending application U.S. patent application Ser. No. 09/849,169, entitled "Distributed Bragg Reflector (DBR) Structure and Method for a Wavelength Tunable Laser" by Yu-Hwa Lo et al., owned by the assignee of this application and incorporated herein by reference.

BACKGROUND INFORMATION

1. Field of the Invention

The present invention relates to the field of wavelength tunable semiconductor devices, and particularly to creating broadly tunable wavelength tunable semiconductor devices.

2. Description of Related Art

Wavelength-tunable lasers serve as a fundamental building block in constructing optical communication and sensing systems. Wavelength-tunable lasers play a central role in particular for dense wavelength division multiplexing (DWDM) systems that form the backbone of today's optical communication network. The term "wavelength-tunable laser" is typically applied to a laser diode whose wavelength can be varied in a controlled manner while operating at a fixed heat sink temperature. At the 1550 nm wavelength regime on which most DWDM systems operate, a wavelength shift of 0.1 nm corresponds to a frequency shift of about 12.6 GHz. At a given heat sink temperature, the central wavelength of a conventional distributed feedback (DFB) laser diode may be red-shifted by as much as 0.3 nm or about 40 GHz due to the rise in the temperature of the junction by Ohmic losses. In contrast, at a given heat sink temperature, the wavelength of a tunable laser may vary by several nanometers, corresponding to hundreds or even thousands of GHz, covering several wavelength channels on the International Telecommunication Union (ITU) grid. Depending on the physical mechanisms of wavelength tuning, the lasing wavelength can be tuned in either positive (red) or negative (blue) direction. Controlled wavelength tunability offers many advantages over conventional fixed wavelength DFB lasers for DWDM operation. It enables advanced all-optical communication networks as opposed to today's network where optics is mainly used for transmission and the network intelligence is performed in the electronic domain. All-optical networks can eliminate unnecessary E/O and O/E transitions and electronic speed bottlenecks to potentially achieve very significant performance and cost benefits. In addition, a less extensive inventory of wavelength-tunable lasers than of laser with a fixed wavelength is required. Keeping a large inventory of lasers for each and every wavelength channel can become a major cost issue. For advanced DWDM systems, the channel spacing can be as narrow as 50 GHz (or about 0.4 nm in wavelength, with as many as 200 optical channels occupying a wavelength range of about 80 nm. For the reasons stated above, wavelength-tunable lasers have attracted considerable interest in optoelectronic device research.

There exist different design principles for tunable lasers. Almost all wavelength-tunable laser designs make use of either the change of refractive indices of semiconductor or the change of laser cavity length to achieve wavelength tuning. For the former, common mechanisms for index change include thermal tuning, carrier density tuning (a combination of plasma effect, band-filling effect, and bandgap shrinkage effect), electro-optic tuning (linear or quadratic effect), and electrorefractive tuning (Franz-Keldysh or quantum confined Stark effect). For DFB lasers, the wavelength of the laser light propagating in the waveguide is basically determined by the grating period $\Lambda$. The free-space lasing wavelength $\lambda$ is given by $\lambda = 2 n_{eff} \Lambda$, where $n_{eff}$ is the effective index of refraction of the waveguide and $\Lambda$ is the period for first-order gratings. Accordingly, the change $\Delta\lambda$ in the lasing wavelength $\lambda$ is directly proportional to the change $\Delta n$ of the index of refraction $n_{eff}$.

Accordingly, it is desirable to have structures and methods for generating broadly wavelength tunable semiconductor devices.

SUMMARY OF THE INVENTION

It is an object of the current invention to provide a method for decreasing the spontaneous recombination rate, B, in a DBR thereby increasing the tuning range of the DBR. According to the current invention, this may be achieved by creating electron confinement regions and hole confinement regions in the waveguide of the DBR.

A preferred process according to the current invention achieves this by engineering the band gaps of the DBR waveguide and cladding materials such that an electron confinement region and a hole confinement region are created in the waveguide of the DBR, thereby reducing the recombination rate and increasing the tuning range. Preferably, the materials selected for use in the DBR may be lattice matched.

Optionally, alternate methods according to the current invention may create two or more thin electron confinement regions and/or two or more thin hole confinement regions. In some cases, multiple thin confinement regions may be used to take advantage of strain compensation in thinner layers thereby broadening the choices of materials appropriate for use in the broadly tunable DBR.

Optionally, a variety of DBR designs comprising graded materials and/or graded interfaces may be used to provide effective electron and/or hole confinement regions may be created using alternate methods according to the current invention.

Optionally, a variety of optical devices such as lasers and/or integrated opto-electronic devices may be created using an alternate method according to the current invention by incorporating one or more conventional processing steps.

Advantageously, the current invention enables the production of DBRs and lasers with broad wavelength tuning ranges making the use of tunable wavelength devices more attractive for a variety of optical networking applications.

DETAILED DESCRIPTION OF PREFERRED EMBODIMENTS

Figure 1:
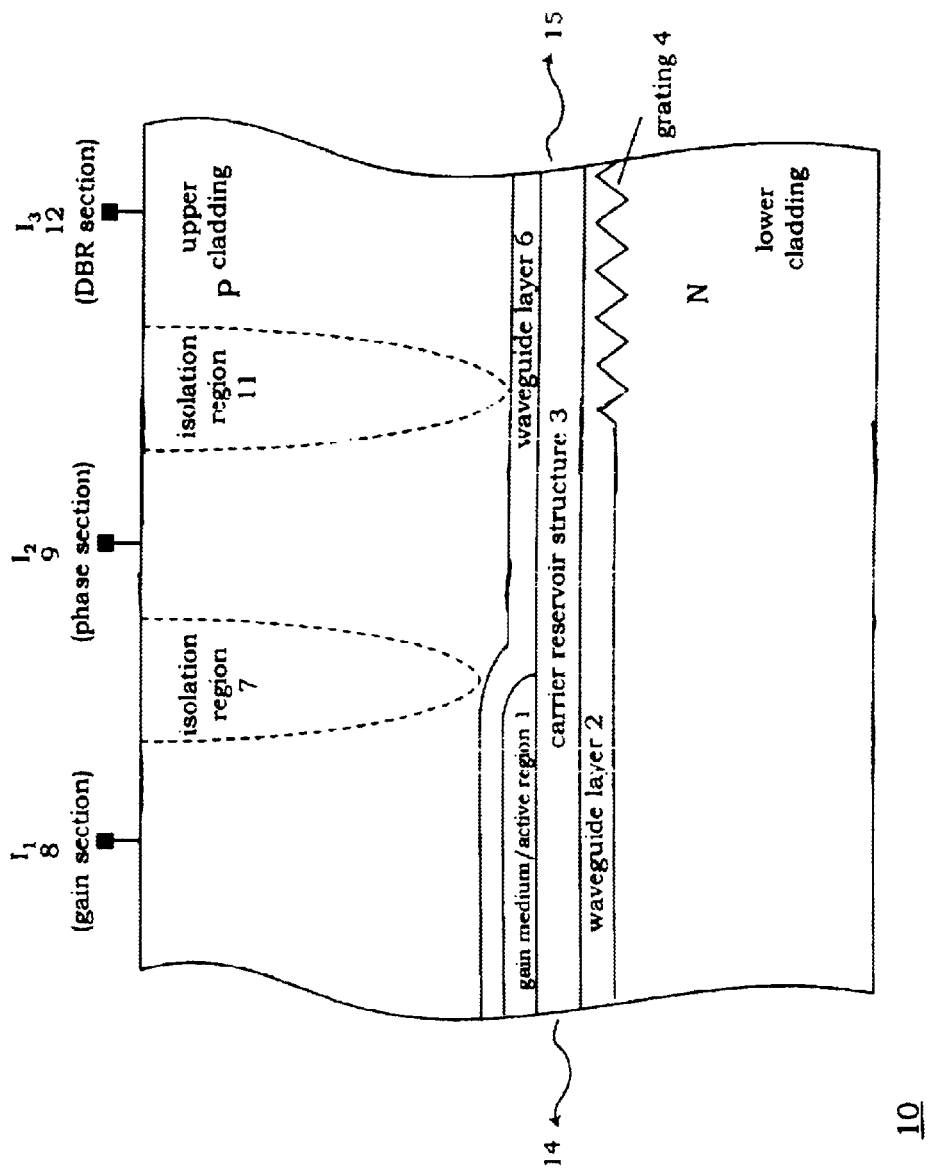
FIG. 1 is an architectural diagram illustrating a first embodiment of a three-section DBR structure in accordance with the present invention.

FIG. 1 is a structural diagram illustrating a first embodiment of a three-section DBR-based laser structure 10 for a wavelength tunable laser. The DBR laser structure 10 has three main sections, a gain or active region 1, a waveguide layer 2, and a carrier reservoir structure 3 placed either above or below the gain layer 1. One of ordinary skill in the art should recognize that additional layers can be added to the DBR laser structure 10 without departing from the spirits in the present invention. A grating 4 is formed that extends originally from the waveguide layer 2. The positioning of the grating 4 can be placed below or above the waveguide 2 and the gain region 1. A waveguide layer 6 is typically placed adjacent to the gain layer 1 and above the carrier reservoir structure 3. The carrier reservoir structure 3 is part of the waveguide and extends continuously across DBR laser structure 10.

The DBR laser structure 10 is intended to illustrate a sample structure. Other conventional details, such as contacts and a substrate layer can be added without departing from the scope in the present invention.

An isolation region 7 separates electrical current from leaking between a gain section $I_1$ 8 and a phase section $I_2$ 9. The gain section $I_1$ 8 is a current pumping into the quantum wells for the active region 1. An isolation region 11 separates electrical current from leaking between the phase section $I_2$ 9 and a DBR section $I_3$ 12. The phase section 9 provides electrical current $I_2$ that changes the reflective index of the medium, which in turn changes the phase. The third section is the DBR section $I_3$ 12. The currents $I_2$ 9 and $I_3$ 12 are used for $\lambda$ wavelength tuning range. The current $I_2$ 9 assures continuous tuning. However, without the ability to change current $I_3$ 12, the resulting graph would show a step function between $\lambda$ and $I_3$ 12. To overcome the step curve, the currents $I_2$ 9 and $I_3$ 12 are adjusted in tandem to obtain smooth continuous tuning and curve. A laser beam can be generated in the direction of 14 or 15

Figure 2:
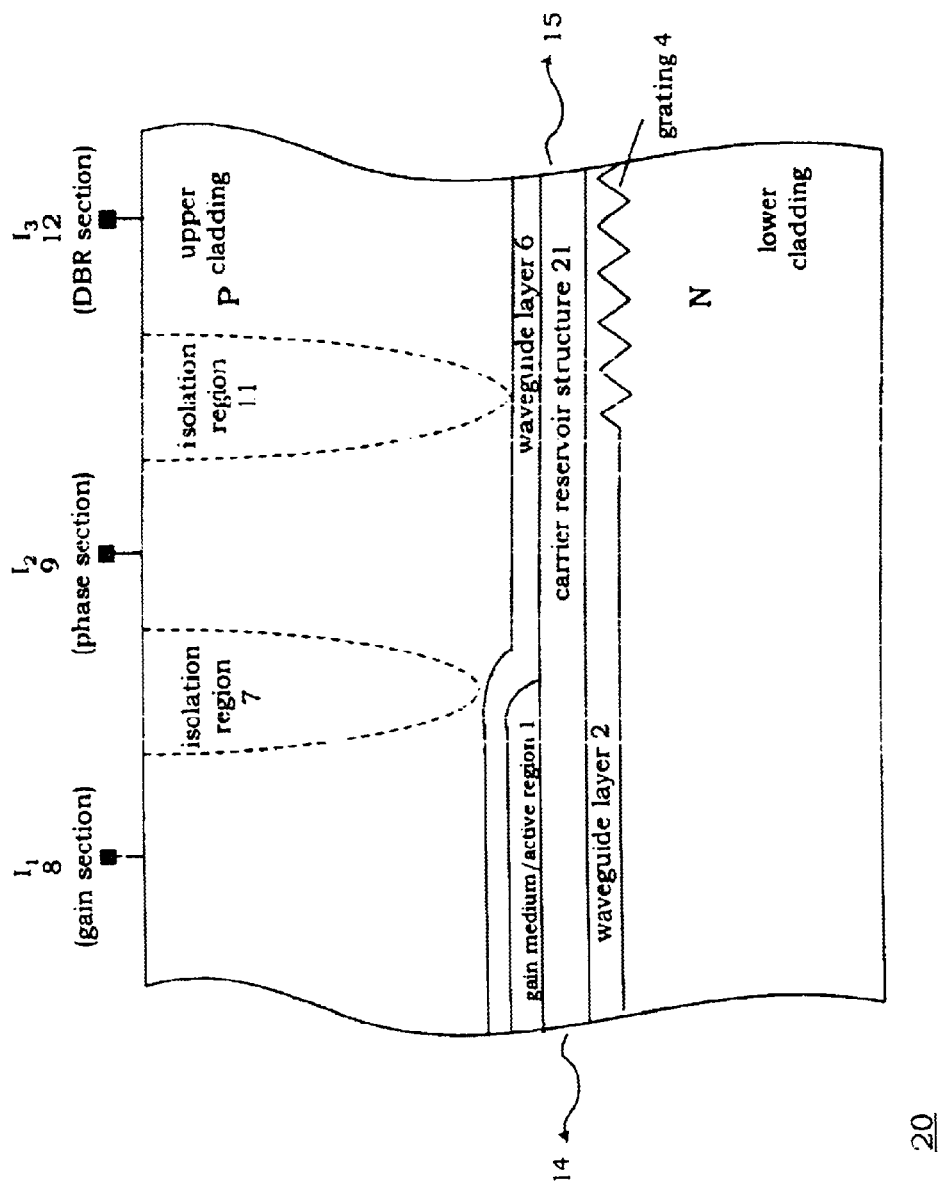
FIG. 2 is an architectural diagram illustrating a second embodiment of a three-section DBR structure in accordance with the present invention.
Figure 3:
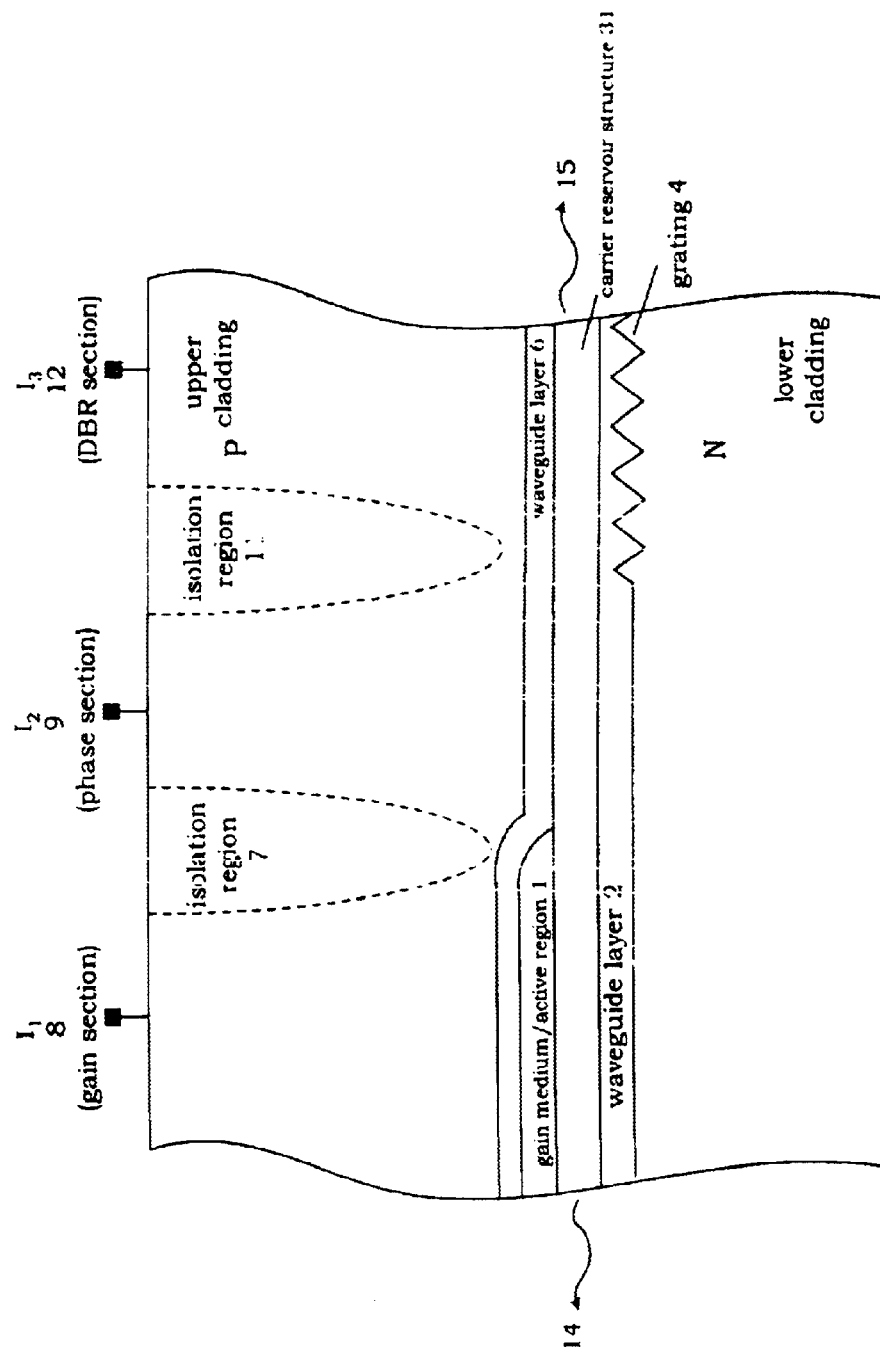
FIG. 3 is an architectural diagram illustrating a third embodiment of a three-section DBR structure in accordance with the present invention.

FIG. 2 is an architectural diagram illustrating a second embodiment of a three-section DBR structure 20 for a wavelength tunable laser. In the DBR structure 20, a carrier reservoir structure 21 extends from a first region, or the phase section $I_2$ 9, to a third region, or the DBR section $I_3$ 12. Preferably, the carrier reservoir structure 21 complies with the order in the vertical direction. The combination of all the layers should form a single mode waveguide. The carrier reservoir structure 21 has a higher bandgap than the bandgap of the active layer 16, thereby minimizing light absorption. FIG. 3 is a structural diagram illustrating a third embodiment of a three-section DBR structure 30 for a wavelength tunable laser. In the DBR structure 30, a carrier reservoir structure 31 is present in the DBR section $I_3$ 12.

Figure 4:
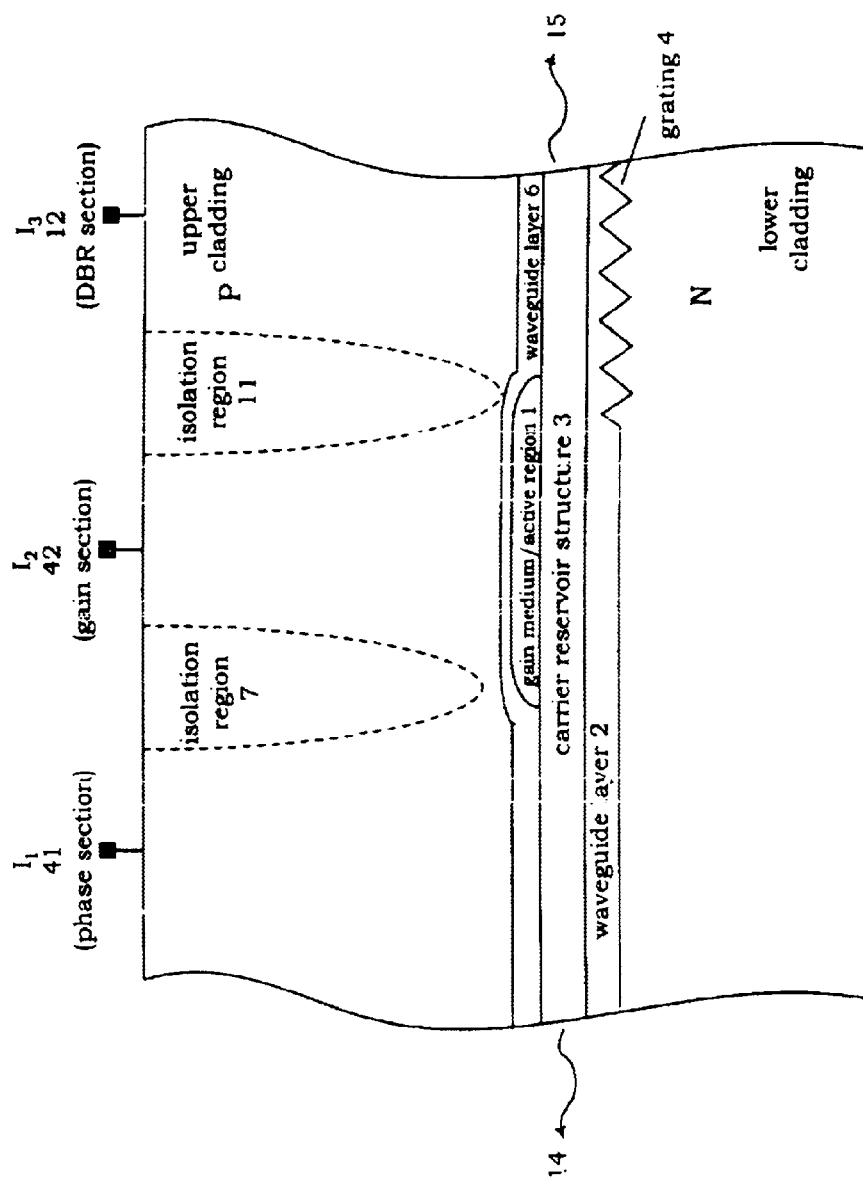
FIG. 4 is an architectural diagram illustrating a fourth embodiment of a three-section DBR structure in accordance with the present invention.

FIG. 4 is a structural diagram illustrating a fourth embodiment of a three-section DBR structure 40 for a wavelength tunable laser. In this embodiment, the gain section $I_1$ 8 is swapped with the phase section $I_2$ 9 as shown in FIG. 1. The DBR structure 40 has a phase section $I_1$ 41 and a gain section $I_2$ 42. Optionally, the phase section I1 41 and the gain section $I_2$ 42 can be coated to alter the reflectivity. It is apparent to one of ordinary skill in the art that the gain section 8, the phase section 9, and the DBR section 12, can be re-arranged in various combinations and orders.

Figure 5:
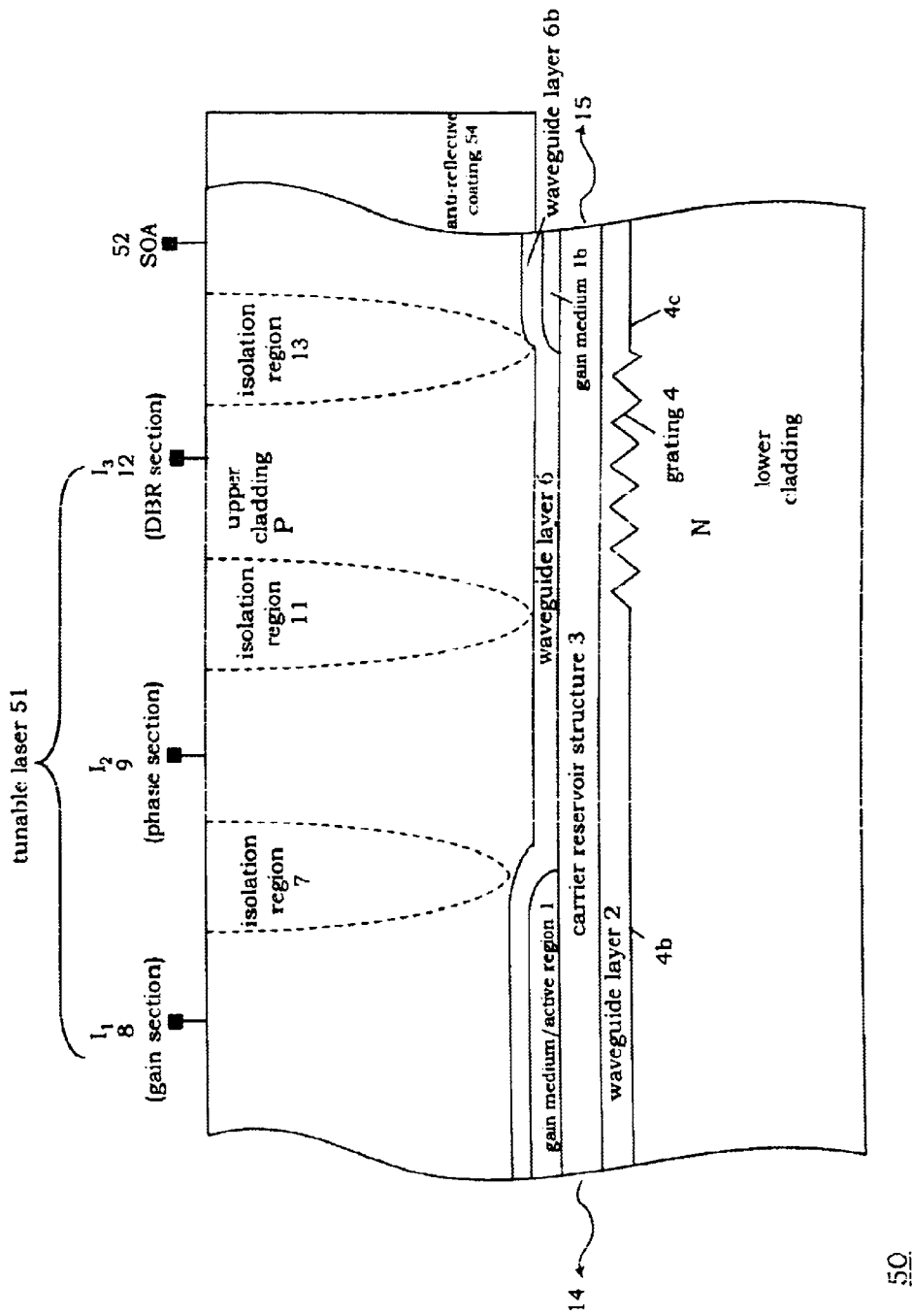
FIG. 5 is an architectural diagram illustrating a fifth embodiment of a three-section DBR structure in accordance with the present invention.

FIG. 5 is an architectural diagram illustrating a fifth embodiment of a three-section DBR structure 50 integrated with a semiconductor optical amplifier (SOA) for a wavelength tunable laser. The three sections of the gain section $I_1$ 8, the phase section $I_2$ 9, and the DBR section $I_3$ 12 make up a tunable laser 51, which is integrated with a SOA $I_4$ 52. The integrated DBR structure with an integrated SOA 50 increases the optical power. An isolation region is placed between the DBR $I_3$ 13 and the SOA 52 to prevent current leakage. The SOA 52 has identical properties as the gain section 11. An antireflective coating (AR) 54 is placed at the end and adjacent to the SOA 52. In the SOA 52 section, a waveguide 6b extends upwardly from near the top of the waveguide 6, a gain medium 1b also extends upwardly from near the bottom of the waveguide 6, and a line 4c extends straightly from the grating 4. The line 4b is at the same or substantially the same height as a line 4c. The gain medium 4b and the waveguide 6b serve to repeat a gain medium layer and a waveguide layer, although the quantum well in the gain medium 1 may be different from the quantum well in the gain medium 1b. For example, the gain medium 1 could have a 30 to 40 nm shift wavelength shift relative to the gain medium 1a.

In the integrated DBR structure 50, there are four current inputs, the gain section $I_1$ 8, the phase section $I_2$ 9, and the DBR section $I_3$ 12, and the SOA section $I_4$ 52. The composition of the first three current inputs, the gain section I1 8, the phase I2 9, and the DBR section I3 12, constitutes the tunable laser 51. The light from the DBR section 12 is integrated with the SOA section 52. A principle difference between an amplifier and a laser is that the amplifier generates a traveling wave in one direction, rather than bi-directional. Some portion of light from the DBR $I_3$ 12 of the laser is passed to the SOA 52, which has a gain section to amplify the received light. The light from the SOA 52 is transmitted outward in one direction, with the AR 54 preventing light signal from entering into the AR 54, or the SOA 52.

Figure 6:
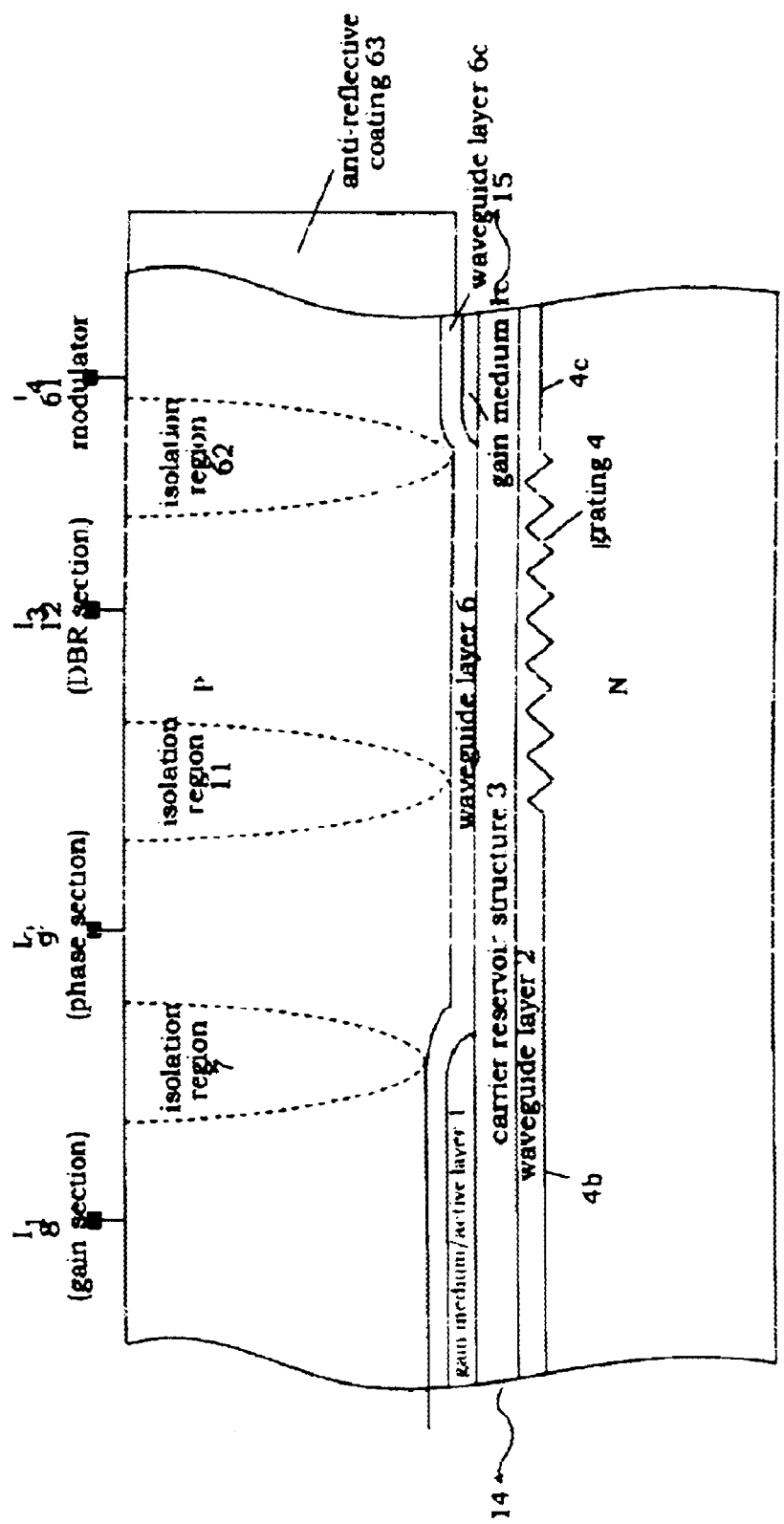
FIG. 6 is an architectural diagram illustrating a sixth embodiment of a three-section DBR structure in accordance with the present invention.

FIG. 6 is an architectural diagram illustrating a sixth embodiment of a three-section DBR structure 60 with an external modulator. The three-section DBR structure 60 has the gain section 8, the phase section 9, the DBR section 12, and a modulator section 61, with an anti-reflective coating 63 placed adjacent to the side on the modulator 61. The first anti-reflective coating 63 can be selected to have high or typical reflective coating. An isolation region 62 prevents current from leaking between the DBR section 12 and the external modulator 61. The placement of the gain section 8 can be swapped with the location of the phase section 9. A tunable laser operates in either a direct current (DC) or near DC level. The external modulator has a quantum well, and is driven by a voltage for modulation. In the modulator 61 section, a waveguide 6c extends upwardly from near the top of the waveguide 6, a gain medium 1c also extends upwardly from near the bottom of the waveguide 6, and the line 4c extends straightly from the grating 4. The line 4b is at the same or substantially the same height as a line 4c. The gain medium 4c and the waveguide 6c serve to repeat a gain medium layer and a waveguide layer. The quantum well in the modulator 61 can be different from the other quantum wells to increase the modulation characteristics, such as the quantum well in the gain medium 1 may be different from the quantum well in the gain medium 1c. The gain medium 1 could have, for example, a 30 to 40 nm shift wavelength shift relative to the gain medium 1a.

Figure 7:
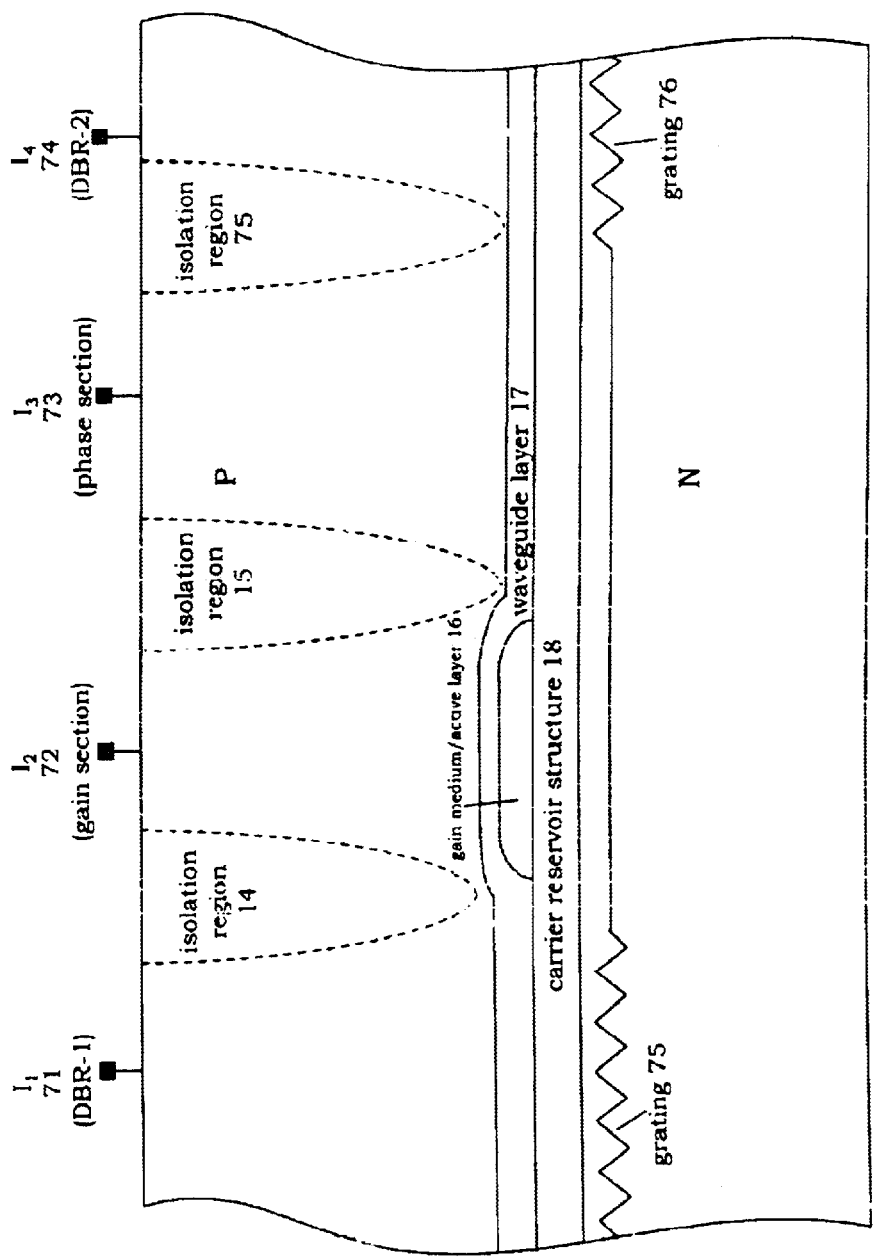
FIG. 7 is an architectural diagram illustrating a seventh embodiment of a three-section DBR structure in accordance with the present invention.

FIG. 7 is an architectural diagram illustrating a seventh embodiment of a three-section DBR structure 70. The three-section DBR structure 70 has a DBR-1 71, a gain section 72, a phase section 73, and a DBR-2 74. A grating 75 extends in the DBR-1 71 section, and a grating 76 extends in the DBR-2 74 section. An isolation region 76 prevents current leakage between the $I_3$ phase section 73 and the $I_4$ DBR-2 section 74. The above embodiments of DBR-based tunable lasers are intended to show several illustrations. One of ordinary skill in the art should recognize that other types of DBR-based combinations can be practiced without departing from the spirits in the present invention.

Figure 8:
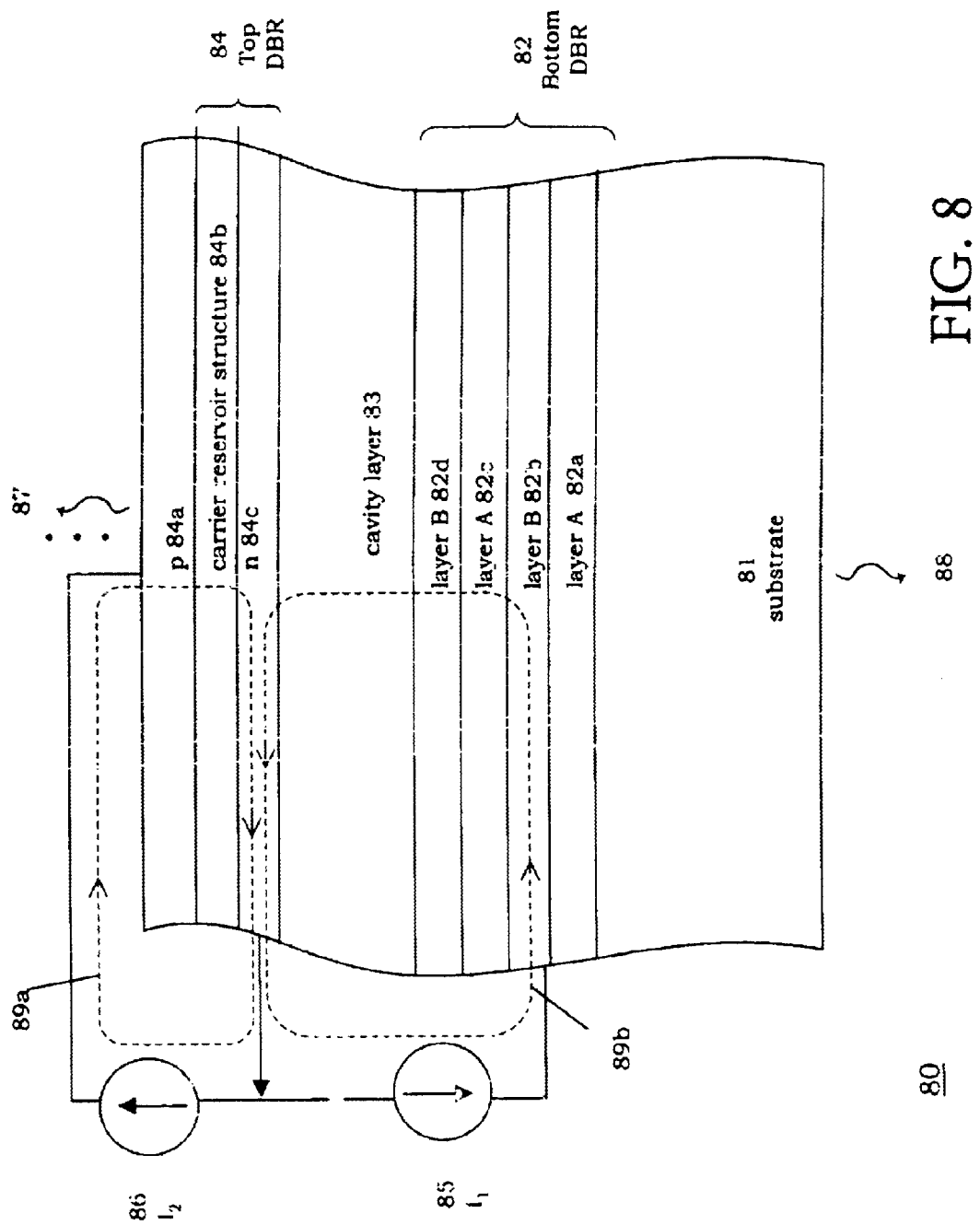
FIG. 8 is an architectural diagram illustrating a first embodiment of a VCSEL structure in accordance with the present invention.

FIG. 8 is an architectural diagram illustrating a first embodiment of a VCSEL structure 80. To view from an up-side down perspective, the VCSEL structure 80 has a substrate 81, a bottom DBR 82, a center cavity layer 83, a top DBR 84, a current $I_1$ 85, and a current $I_2$ 86. The bottom DBR 82 is formed with a layer A 82a, a layer B 82b, a layer A 82c, and a layer B 82d, to form a periodic structure. Each layer in the layer A 82a, the layer B 82b, the layer A 82c, and the layer B 82d is a quarter-wave length. In addition, each A layer and B layer has a different refractive index. For example, if $N_A$ denotes the refractive index of the layer A 82a, and $N_B$ denotes the refractive index of the layer B 82b, then $N_A \neq N_B$. The layer A 82a has an approximately layer thickness of, as represented by the equation $$T_A = \frac{\lambda}{4N_A}.$$

The layer B 82b has an approximately layer thickness of, as represented by the equation $$T_B = \frac{\lambda}{4N_B}.$$

The cavity layer 83 has a gain medium or a quantum well. It is apparent to one of ordinary skill in the art that additional A layer and B layers can be added to the bottom DBR 81 without departing from the spirits in the present invention.

Doping materials are injected into the VCSEL 80 structure, such as making a p-doped 84a into the top DBR 84, and an n-doped 84c into the top DBR 84, with a carrier reservoir structure 84b in between. When operating a laser, the optical beam or light bounces back and forth between the bottom DBR 82 and the top DBR 84, and the optical beam exits the VCSEL structure 80 in a direction 87 or a direction 88.

Two currents $I_1$ 85 and $I_2$ 86, are injected into the VCSEL structure 80. The current $I_1$ 85 adjusts the carrier in the carrier reservoir structure 84b with the current flows in the direction as shown in a loop 89a through the p 84a layer, the carrier reservoir structure 84b, and the n 84c layer. The current $I_2$ 86 is used to pump the laser, with the current flows in the direction as shown in a loop 89b through the layer B 82b, the layer A 82c, the layer B 82d, and the cavity layer 83. The wavelength is determined by, neglecting any possible thermal effect, with a tuning curve. This is commonly referred to as phase tuning. When increasing the current $I_2$ 86, the carrier in the carrier reservoir structure 84b is increased, thereby increasing the electrons and holes. The index of reflection in the VCSEL structure 80 in turn drops, and thus increases the effective cavity length. When a time t increases, the wavelength is changed. Therefore, by increasing the current the current $I_2$ 86, the carrier compensation in the carrier reservoir structure 84b is creased, the index of reflection is reduced, the cavity length is effectively increased, and the wavelength is in turn increased.

The wavelength tuning range of the first order is normalized to a central wavelength, represented by the equation $$\frac{\Delta\lambda}{\lambda} \alpha \frac{\Delta n}{n}\eta,$$

where the factor $\eta$ is determined by the physical location of the carrier reservoir structure 84b with respect to the center of cavity. A percentage of tuning relates to the percentage of index change. The effect of the design can inject a substantial amount of electrons and holes, resulting in a more substantial change in index for the same amount of current. Our ratio is therefore increased, and hence the wavelength is increased. The closer the carrier reservoir structure 84b to the cavity, the more effective the tuning range will be.

Figure 9:
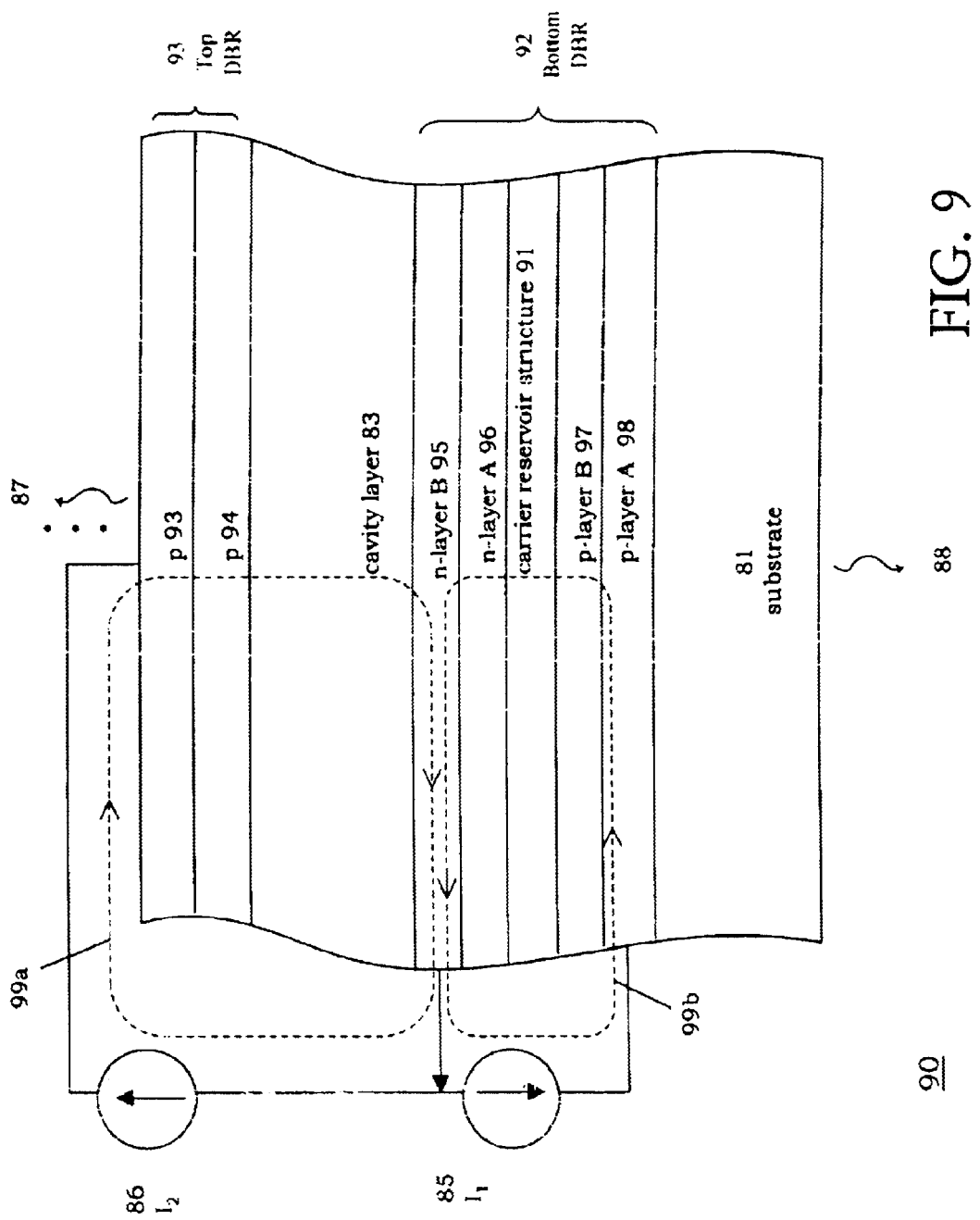
FIG. 9 is an architectural diagram illustrating a second embodiment of a VCSEL structure in accordance with the present invention.

FIG. 9 is an architectural diagram illustrating a second embodiment of a VCSEL structure 90. A top DBR 93 has a p-layer 94 and an n-layer 95. A bottom DBR 92 includes a p-layer A 98, a p-layer B 97, a carrier reservoir structure 91, an n-layer A 96, and n-layer 95. The current 86 $I_2$ flows in the direction as shown in a loop 99a, through the p-layer 93, the p-layer 94, and the cavity layer 93. The current 85 $I_1$ flows in the direction as shown in a loop 99b, through the p-layer A 98, the p-layer B 97, the carrier reservoir structure 91, the n-layer A 96, and the n-layer B 95.

Figure 10:
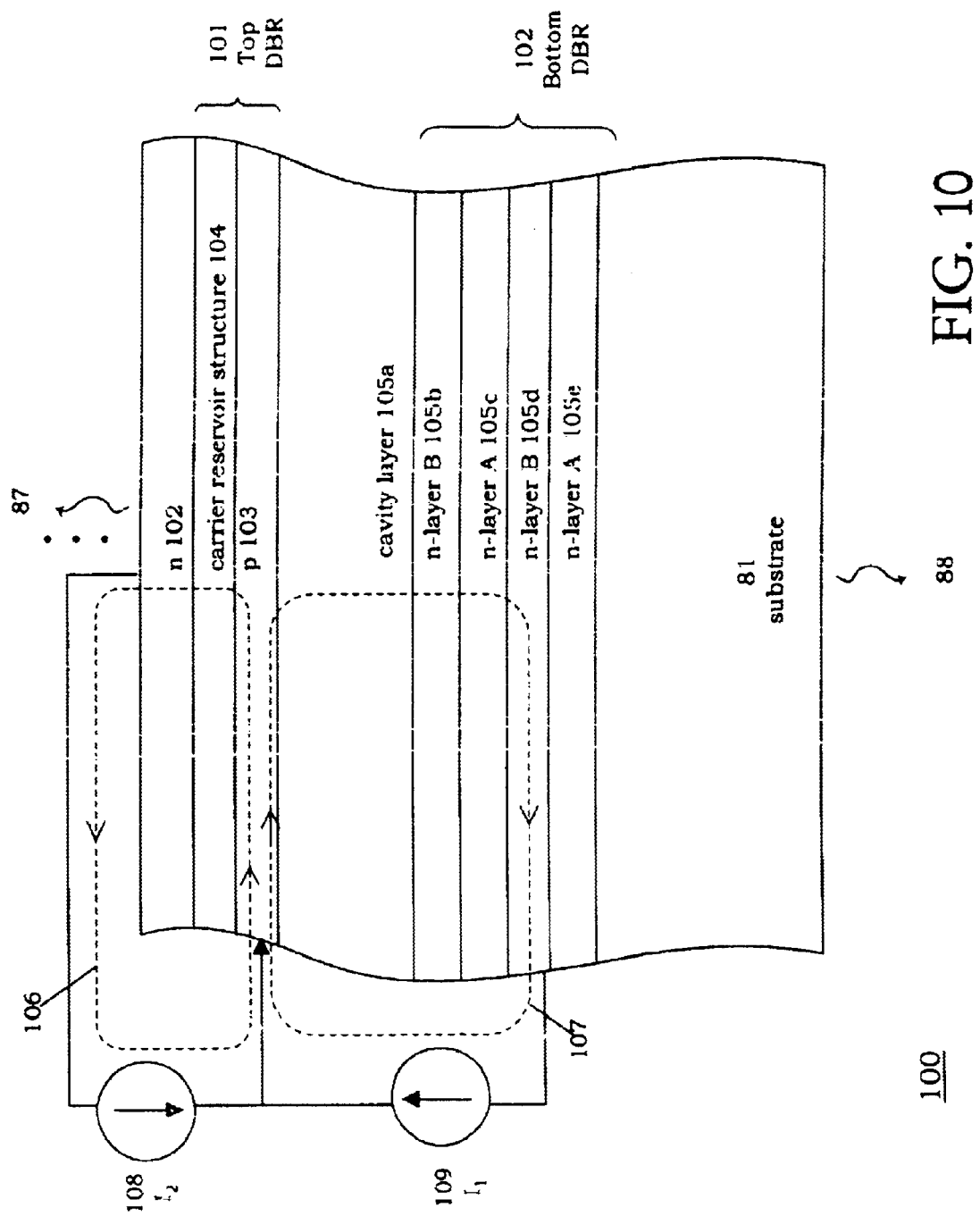
FIG. 10 is an architectural diagram illustrating a third embodiment of a VCSEL structure in accordance with the present invention.

FIG. 10 is an architectural diagram illustrating a third embodiment of a VCSEL structure 100. The VCSEL structure 100 has a reverse doping, with an n-p layer to form a cavity. Instead of an n-p-n formation, the VCSEL structure 100 has a p-n-p formation. A top DBR 101 is formed with an n-layer 102 and a p-layer 103, with a carrier reservoir structure 104 placed in between the n layer 102 and the p layer 103. A bottom DBR 102 is constructed with a cavity layer 105a that has a gain medium within, an n-layer 105b, an n-layer 105c, an n-layer 105d, an n-layer 105e. A current source $I_2$ 108 is used for injecting carrier into the carrier reservoir structure 104. With current flows in the direction as shown in a loop 106, through the p-layer 103, the carrier reservoir structure 104, and the n-layer 102. A current source $I_1$ 109 is used for pumping the laser, with current flows in the direction as shown in a loop 107, though the cavity layer 105a, the n-layer 105b, the n-layer 105c, the n-layer 105d, the n-layer 105e.

Figure 11:
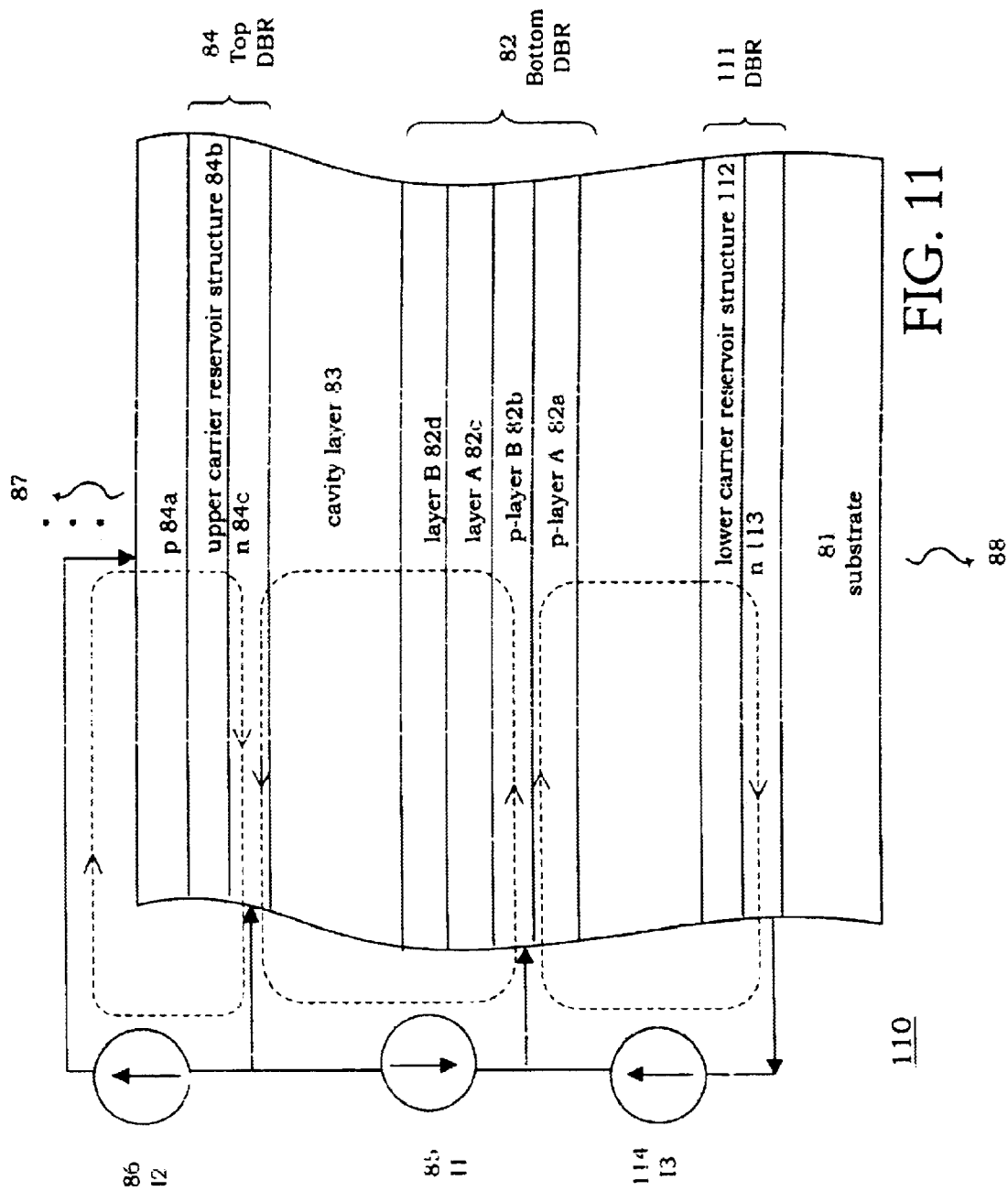
FIG. 11 is an architectural diagram illustrating a fourth embodiment of a VCSEL structure in accordance with the present invention.

FIG. 11 is an architectural diagram illustrating a fourth embodiment of a VCSEL structure 110. The VCSEL structure 110 has multiple carrier reservoir structure layers, thereby increasing the tuning range and expanding a more complex device fabrication. Another DBR 111 is added to the VCSEL structure 110, with a carrier reservoir layer 112, and an n-layer 113. The current $I_2$ 86 pumps carriers into the upper carrier reservoir structure 84b. A current $I_3$ 114 pumps carriers into the lower carrier reservoir structure 112, and is used for tuning in the DBR layer 111, resulting in the increase in the overall tuning range of the VCSEL structure 110.

Figure 12:
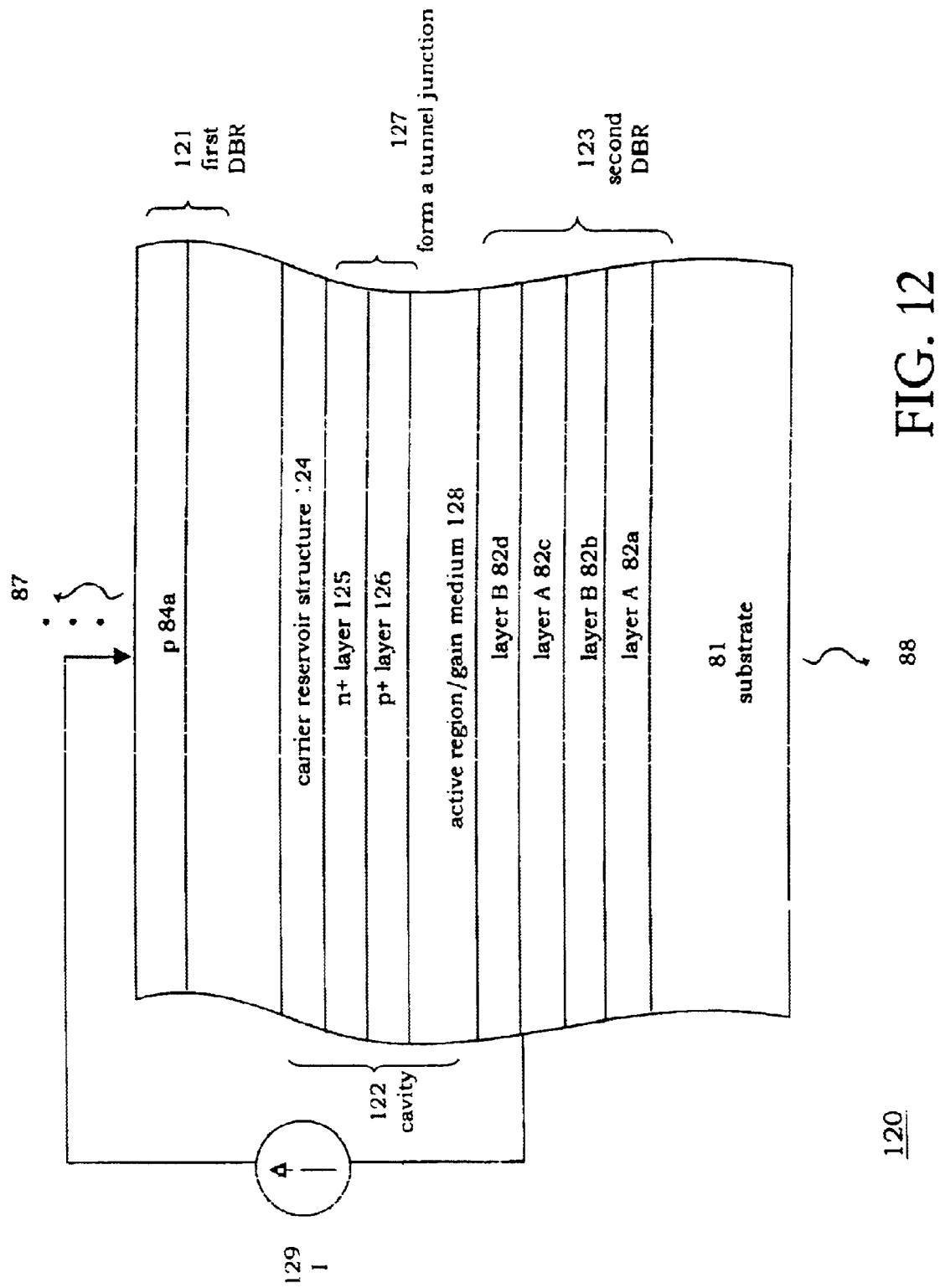
FIG. 12 is an architectural diagram illustrating a fourth embodiment of a VCSEL structure in accordance with the present invention.

FIG. 12 is an architectural diagram illustrating a fourth embodiment of a VCSEL structure 120 for maximizing the factor eta. $\eta$. The VCSEL structure 120 is designed with a first DBR 121, a cavity 122, and a second DBR 123, with a carrier reservoir structure 124 placed inside the cavity 122. A tunnel junction 127 is formed from the combination of the n+ layer 125 and the p+ layer 126. An active layer 128 is stacked underneath the p+ layer 126. In VCSEL structure 120, a single current source I 129 provides the gain as well as tuning. In other words, the change in a wavelength is proportional to the fluctuation of current I 129.

Figure 13:
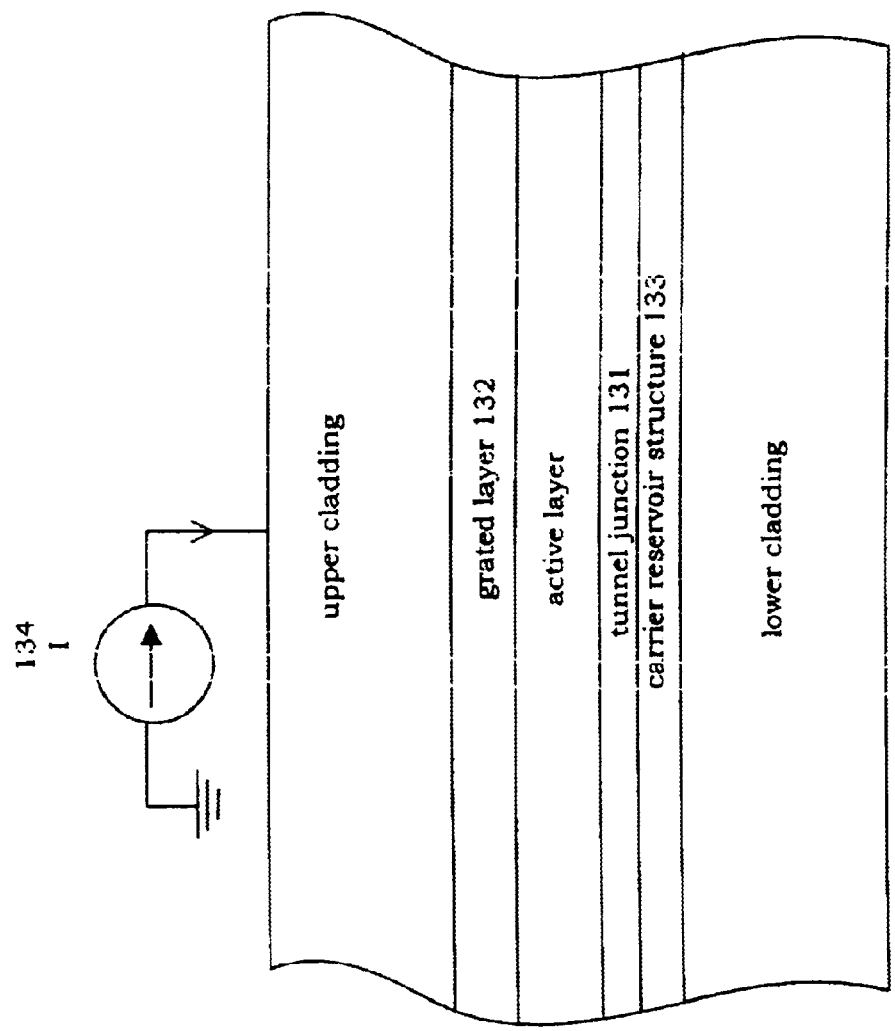
FIG. 13 is an architectural diagram illustrating a first embodiment of a DFB structure in accordance with the present invention.

FIG. 13 is an architectural diagram illustrating a first embodiment of a DFB structure 130. The DFB structure 130 has a tunnel junction 131, a grating layer 132, with a carrier reservoir structure or tuning layer 133. The combination of layers in the DFB structure 130 support a single mode operation. When a current I 134 increases above certain threshold, the electrons and holes concentration increases through the tunnel junction 131, and the index of reflection decrease, and the lasing wavelength decreases. The lasing wavelength is represented by, $\lambda_{DFB}=2\Lambda\times n$, where the symbol $\Lambda$ denotes the grating period, and where n denotes the reflective index.

Figure 14:
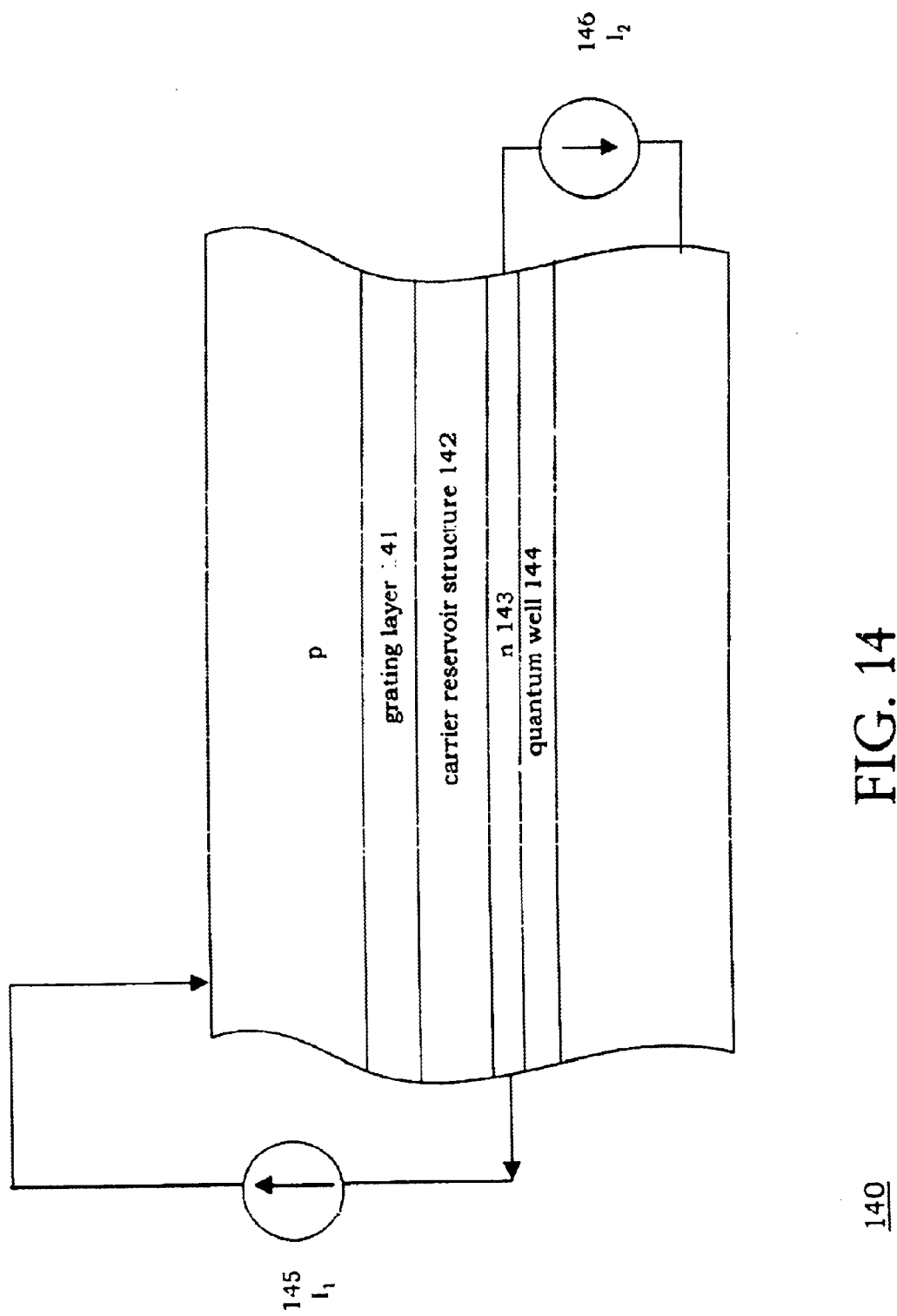
FIG. 14 is an architectural diagram illustrating a third embodiment of a DFB structure in accordance with the present invention.

FIG. 14 is an architectural diagram illustrating a third embodiment of a DFB structure 140. In this embodiment, the tunable laser is turned by 90 degrees. While FIG. 13 is viewed from the direction of light propagation, FIG. 14 shows the cross sectional view of a waveguide. The DFB structure 140 has a grating layer 141, a carrier reservoir structure 142, an n-layer 143, and a quantum well 144. A current $I_1$ 145 provides the laser current. The current $I_2$ 146 provides the tuning current, flowing into the tuning region. The current $I_1$ 145 determines the gain, and the $I_2$ 146 current determines the tuning.

Figure 15:
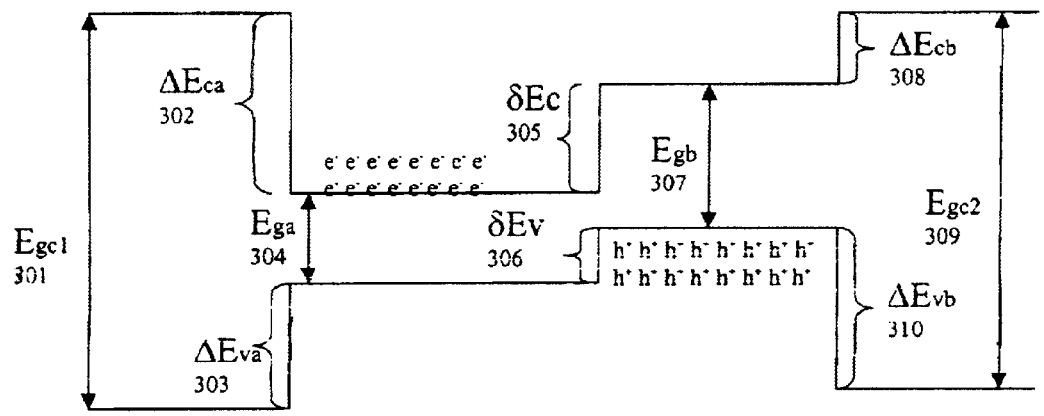
FIG. 15 illustrates a band gap diagram and a layer structure for a preferred embodiment in accordance with the present invention.
Figure 15:
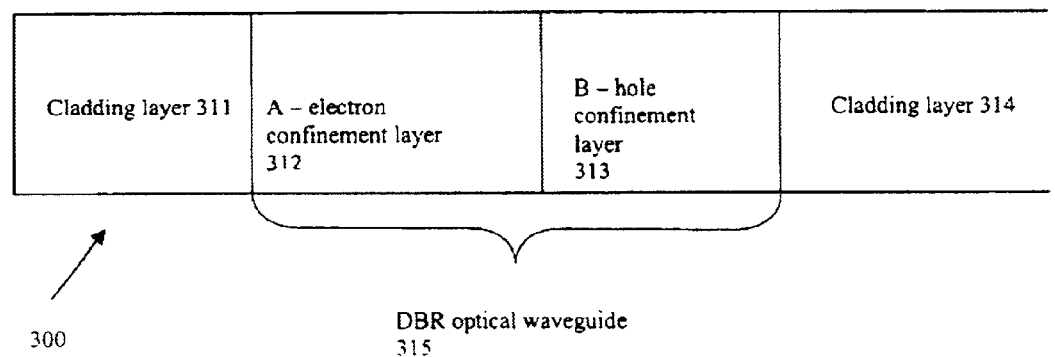

FIG. 15 illustrates a band gap diagram and a layer structure for a preferred embodiment of the current invention. In this example, a DBR optical waveguide 315 comprised of two layers 312 and 313 is disposed on top of a first cladding layer 311 and beneath a second cladding layer 314. Alternately, buried heterostructure (BH) based devices may be constructed according to an alternate embodiment of the current invention. For a BH based device, additional cladding may be provided by the material surrounding the buried waveguide. Typically, the cladding layers 311 and 314 are doped such that one is n-type and the other is a p-type. According to a preferred embodiment of the current invention, the cladding layers should have opposite doping types. However, the doping types of the two cladding layers 311 and 314 may be swapped without adversely impacting the tunability of the DBR. Similarly, according to a preferred embodiment of the current invention, the relative positions of the layers comprising the electron confinement region 312 and the hole confinement region 313 may be swapped without adversely impacting the tunability of the DBR. According to the current invention, the band gap of the first cladding layer ($E_{gc1}$) 301 and the band gap of the second cladding layer ($E_{gc2}$) 309 must both be larger than the characteristic band gap of the electron confinement region ($E_{ga}$) 304 and the characteristic band gap of the hole confinement region ($E_{gb}$) 307 in order to create an effective waveguide.

$$E_{gc1}, E_{gc2} > E_{ga}, E_{gb}$$

For the DBR 300, the material used for the electron confinement region 312 must have bandgap offsets from the first cladding layer 311 and from the adjacent hole confinement layer 313 such that the conduction band offsets $\Delta E_{ca}$ 302 and $\delta E_c$ 305 are in excess of the thermal energy, kT, in order to effectively confine electrons:

$$\Delta E_{ca}, \delta E_c > kT$$

where:
 k=Boltzmann's constant
 T=absolute temperature
Preferably, the offsets $\Delta E_{ca}$ 302 and $\delta E_c$ 305 are greater than 2 kT:

$$\Delta E_{ca}, \delta E_c > 2 \text{ kT}.$$

Similarly, for DBR 300, the material used for the hole confinement region 313 must have bandgap offsets from the second cladding layer 314 and from the adjacent electron confinement layer 312 such that the valence band offsets 306 and 310 are in excess of the thermal energy, kT, in order to effectively confine holes:

$\Delta E_{vb}, \delta E_v > kT.$

Preferably, the offsets 306 and 310 are greater than 2 kT:

$\Delta E_{vb}, \delta E_v > 2\ kT.$

A variety of materials systems meeting these criteria may be used to create a broadly tunable DBR. For example InGaAsP lattice matched to InP may be chosen as an electron confinement layer 312 material and used with an InGaAlAs hole confinement layer 313 lattice matched to InP. Alternately, InGaAsSb lattice matched to InP may be chosen as an electron confinement layer 312 material and used with an InGaAlAsSb hole confinement layer 313 lattice matched to InP. According to the current invention, a variety of growth or deposition techniques may be used to create the DBR structure. For example, DBR structures according to the current invention may be created using one or more techniques such as, but not limited to: Molecular Beam Epitaxy (MBE), Chemical Vapor Deposition (CVD) or Metal-Organic Chemical Vapor Deposition (MOCVD).

An optical waveguide according to the current invention may be described according to three dimensions:

1) a first direction parallel to the direction of light propagation,
2) a second direction perpendicular to the first direction and
3) a third direction, perpendicular to both the first and second directions. For the structure illustrated in FIG. 15, the second direction may be the thickness 320 and the third direction may be a third mutually perpendicular direction, or the breadth 321. For a structure 300, the second direction may coincide with the direction of current flow. However, alternate embodiments of the current invention may be implemented with different architectures such that the second direction or thickness does not coincide with the direction of current flow. For example, an alternate embodiment of the current invention may be based on a transverse junction striped laser (TJS). For a TJS based structure, the third direction, or breadth of the structure may or may not coincide with the direction of current flow.

In one embodiment, the thickness of the DBR optical waveguide layer is designed to support a single optical mode. A typical optical waveguide layer according to the current invention is about 2000 Å thick. Preferably, the thickness of the layer providing an electron confinement region is greater than the thickness of the layer providing a hole confinement layer. This preference is related to the $sp^3$ nature of the semiconductors used in the optical waveguide layer which results in a relatively low density of states for electrons in the electron confinement region compared to the relatively high density of states for holes in the hole confinement region. Similarly, it is preferable that the electron confinement barrier $\delta E_c$ created by the conduction band offset be greater than the hole confinement barrier $\delta E_v$ created by the valence band offset. For this reason, the minimum size of the electron confinement region should be larger than the minimum size of the hole confinement region in order to prevent electrons from piling up in the electron confinement region and jumping the $\delta E_c$ barrier provided by the conduction band offset of adjacent regions. Furthermore, by minimizing the thickness of the hole confinement region, excess optical loss related to inter-valence band absorption in $sp^3$ materials may be minimized. However, according to alternate embodiments of the current invention, other considerations comprising processing parameters or strain related issues may lead to DBR designs where the thickness of the hole confinement region is equal to or greater than the size of the electron confinement region. Similarly, according to alternate embodiments of the current invention, other considerations may lead to DBR designs comprising an electron confinement barrier $\delta E_c$ created by the conduction band offset that is less than or equal to the hole confinement barrier $\delta E_v$ created by the valence band offset.

Figure 16:
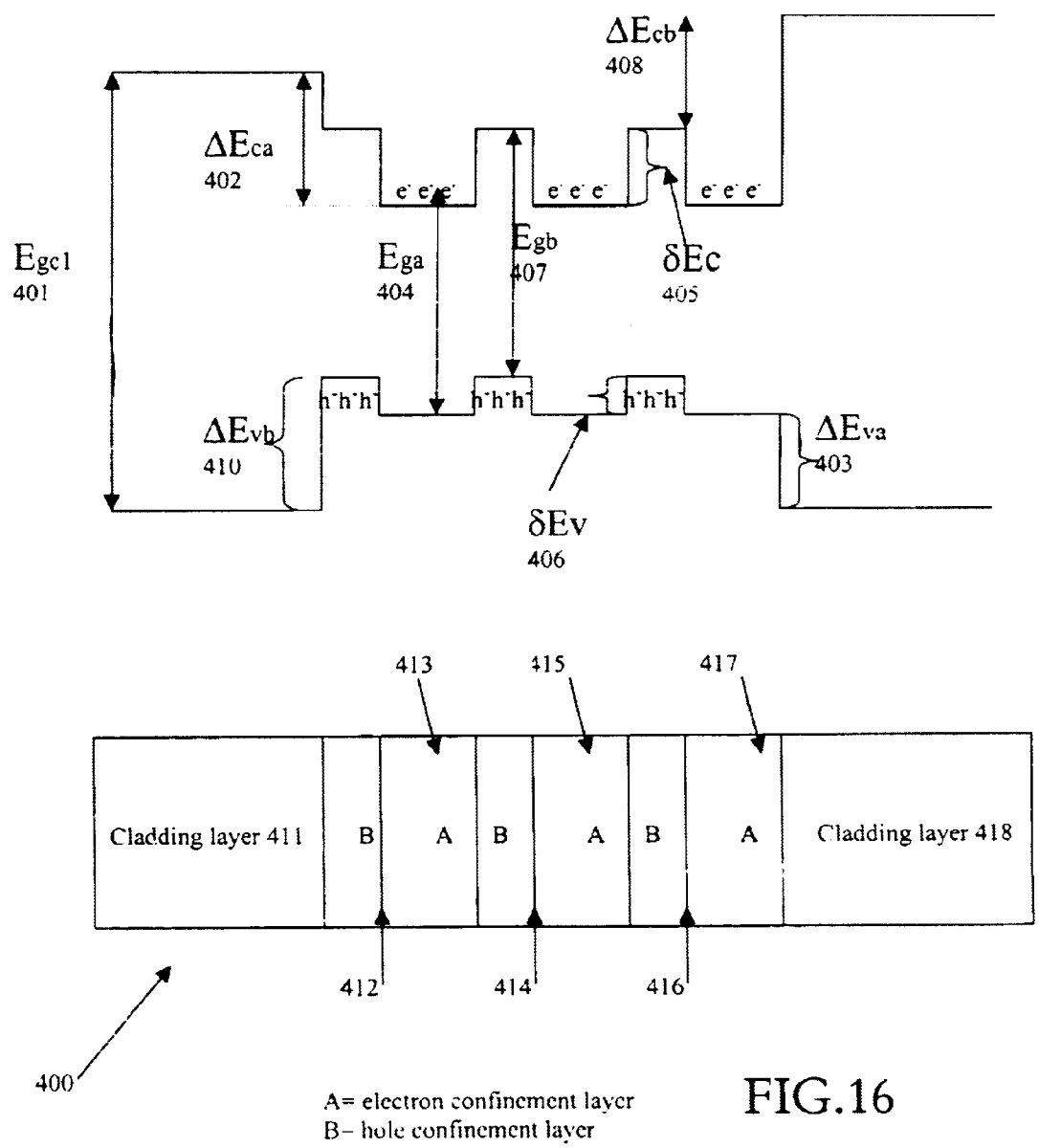
FIG. 16 illustrates a band gap diagram and a layer structure for an alternate embodiment of the current invention comprising multiple thin electron confinement regions and multiple thin hole confinement regions in accordance with the present invention.
Figure 17:
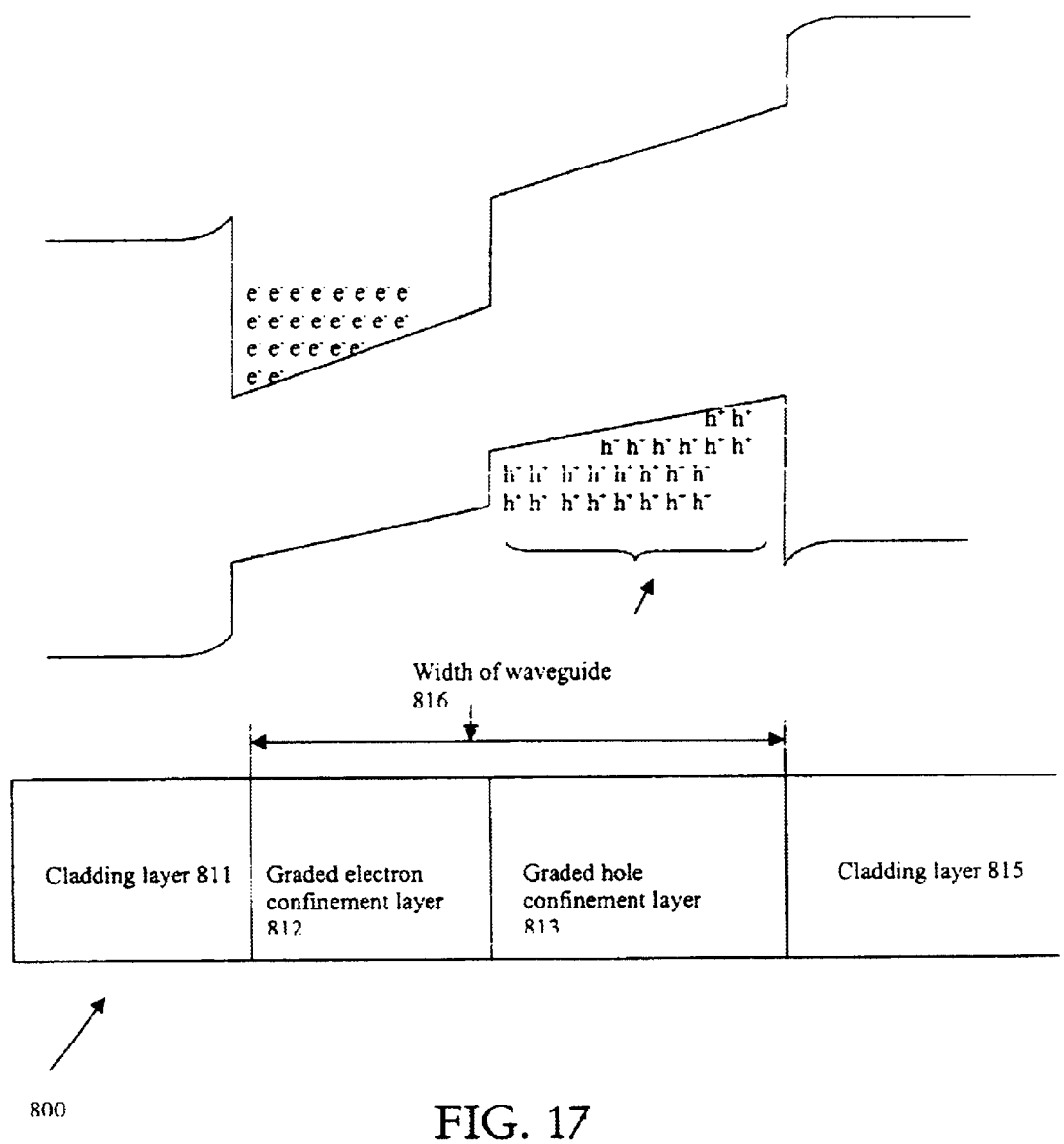
FIG. 17 illustrates an alternate embodiment of the current invention with a graded electron confinement layer and a graded hole confinement layer in accordance with the present invention.

FIG. 17 illustrates a band gap diagram and a layer structure for an alternate embodiment according to the current invention 400 comprising multiple thin electron confinement regions 413, 415, 417 and multiple thin hole confinement regions 412, 414, 416. For this type of design, lattice matching may be a less important consideration due to the strain compensation that may take place in thin layers. Although FIG. 16 illustrates a DBR where the electron confinement layers are thicker than the hole confinement layers, alternate embodiments of the current invention may comprise layers providing electron and/or hole confinement regions of the same or varying thickness, compositions and/or electronic properties. Typically, the layers providing electron confinement regions would be adjacent to layers providing conduction band offset boundaries greater than the thermal energy, kT, and the layers providing hole confinement regions would be adjacent to materials providing valence band offset boundaries greater than kT. As previously discussed, preferably, the valence band offset boundaries and the conduction band offset boundaries are greater than 2 kT.

For DBR 300 and 400, sharp interfaces between the cladding layers, electron confinement regions and hole confinement regions are illustrated. In these examples, the barriers providing electron and hole confinement are created with sharply defined jumps in band gap energy levels. However, alternate embodiments of the current invention may provide valence band offset boundaries and conduction band offset boundaries using a variety of designs comprising graded materials and/or graded interfaces. For example, a layer of graded material may exist at one or more of the layer interfaces. FIG. 17 illustrates an alternate embodiment of the current invention with a graded electron confinement layer 812 and a graded hole confinement layer 813. In this example, the energy level of the lowest conduction band and the energy level of the highest valence band vary across the thickness of the waveguide.

Figure 18:
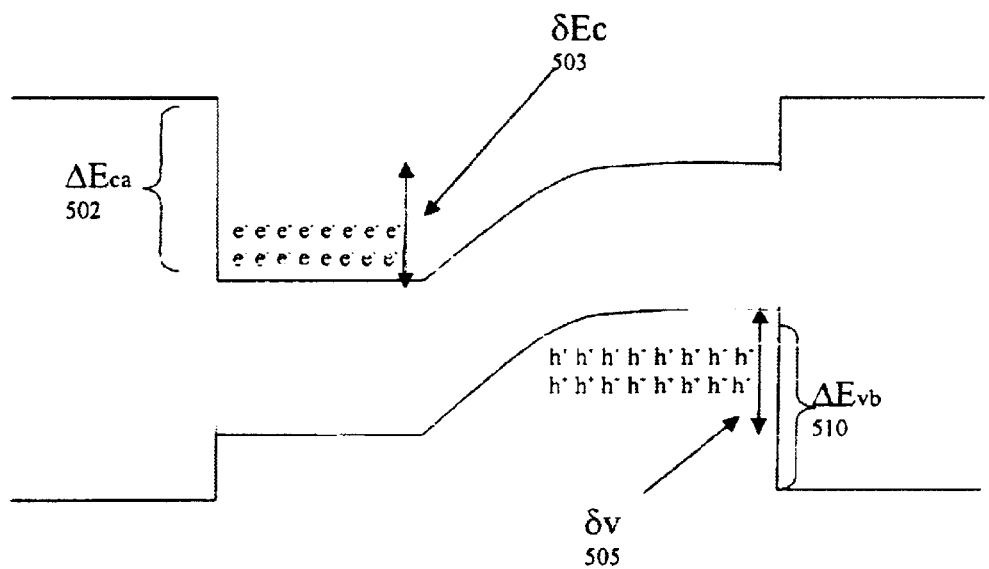
FIG. 18 illustrates a band gap diagram and layer structure for an alternate embodiment in accordance with the present invention.
Figure 18:
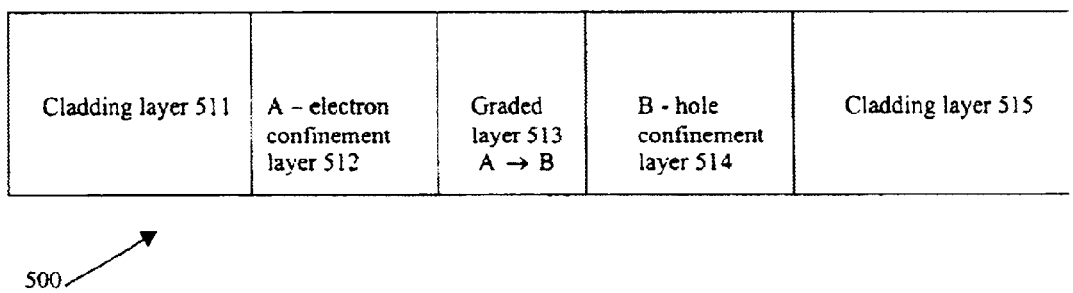
Figure 19:
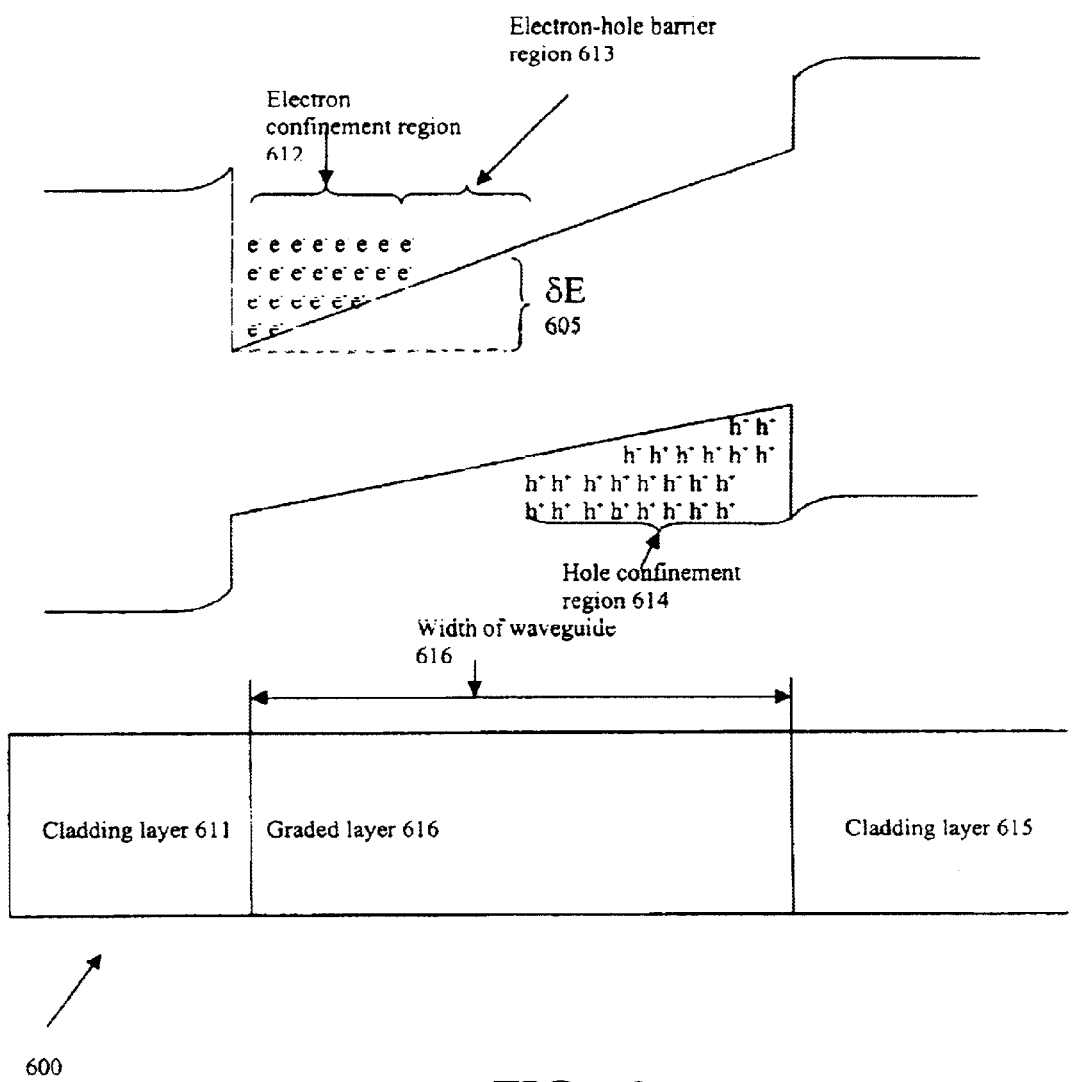
FIG. 19 illustrates a band gap diagram and layer structure for an alternate embodiment in accordance with the present invention.

Furthermore, the cladding layers may comprise one or more layers of material with differing band gaps or graded material and still effectively achieve the purpose of a cladding layer. For example, FIGS. 18 and 19 illustrate band gap diagrams and layer structures for alternate embodiments of the current invention. For DBR 500, electron-hole isolation is achieved using a graded layer 513 by varying the materials composition and band gap. Graded layer 513 creates an effective conduction band offset between the electron confinement layer 512 and the hole confinement layer 514 of $\delta E_c$ 503. Similarly, graded layer 513 creates an effective valence band offset between the electron confinement layer 512 and the hole confinement layer 514 of $\delta E_v$ 505.

In an alternate embodiment, a hole confinement region 612 and an electron confinement region 614 are created within a single graded layer 616 for DBR 600. In this example, electron-hole confinement may be achieved through band structure tilting due to the variation in materials composition across the waveguide. According to an alternate embodiment of the current invention, a local minimum energy level is established in the lowest level of the conduction band resulting in the creation of an electron confinement region 612. In order to create an effective electron-hole barrier region for confining electrons in an alternative embodiment of the current invention such as DBR 600, at least two criteria must be satisfied. First, the conduction band offset δEc 605 in the middle of the graded layer 616 must be much greater than the thermal energy, kT, at operating temperatures:

$$\delta Ec \gg kT$$

Preferably, the average conduction band offset δEc 605 in the middle of the graded layer 616 is more than twice the thermal energy, 2 kT, at operating temperatures:

$$\delta Ec > 2\,kT$$

Second, a sufficiently large electric field must be generated by the band structure tilting to offset the Coulombic forces driving the electrons and holes together. Based on the following approximation:

$$eN/(4\pi\epsilon W^2) \leq \delta Ec/(eW),$$

the following design constraint may be adopted:

$$\delta Ec \geq e^2 N/(4\pi\epsilon W) \sim N/W,$$

where:
  e=elementary charge
  N=carrier concentration
  ε=permittivity constant
  W=thickness of the waveguide 616
  δEc=conduction band offset 605 in the middle of the graded layer 616

Similarly, according to an alternate embodiment of the current invention, a local maximum energy level is established in the highest level of the valence band resulting in the creation of a hole confinement region 614. In order to create an effective electron-hole barrier region for confining holes in an alternative embodiment of the current invention such as DBR 600, at least two criteria must be satisfied. First, the valence band offset δEv 606 in the middle of the graded layer 616 must be much greater than the thermal energy, kT, at operating temperatures:

$$\delta Ev \gg kT$$

Preferably, the average valence band offset δEv 606 in the middle of the graded layer 616 is more than twice the thermal energy, 2 kT, at operating temperatures:

$$\delta Ev > 2\,kT.$$

Second, a sufficiently large electric field must be generated by the band structure tilting to offset the Coulombic forces driving the electrons and holes together. Based on the following approximation:

$$eN/(4\pi\epsilon W^2) \leq \delta Ev/(eW),$$

the following design constraint may be adopted:

$$\delta Ev \geq e^2 N/(4\pi\epsilon W) \sim N/W,$$

where:
  e=elementary charge
  N=carrier concentration
  ε=permittivity constant
  W=thickness of the waveguide 616
  δEv=valence band offset 606 in the middle of the graded layer 616

Figure 20:
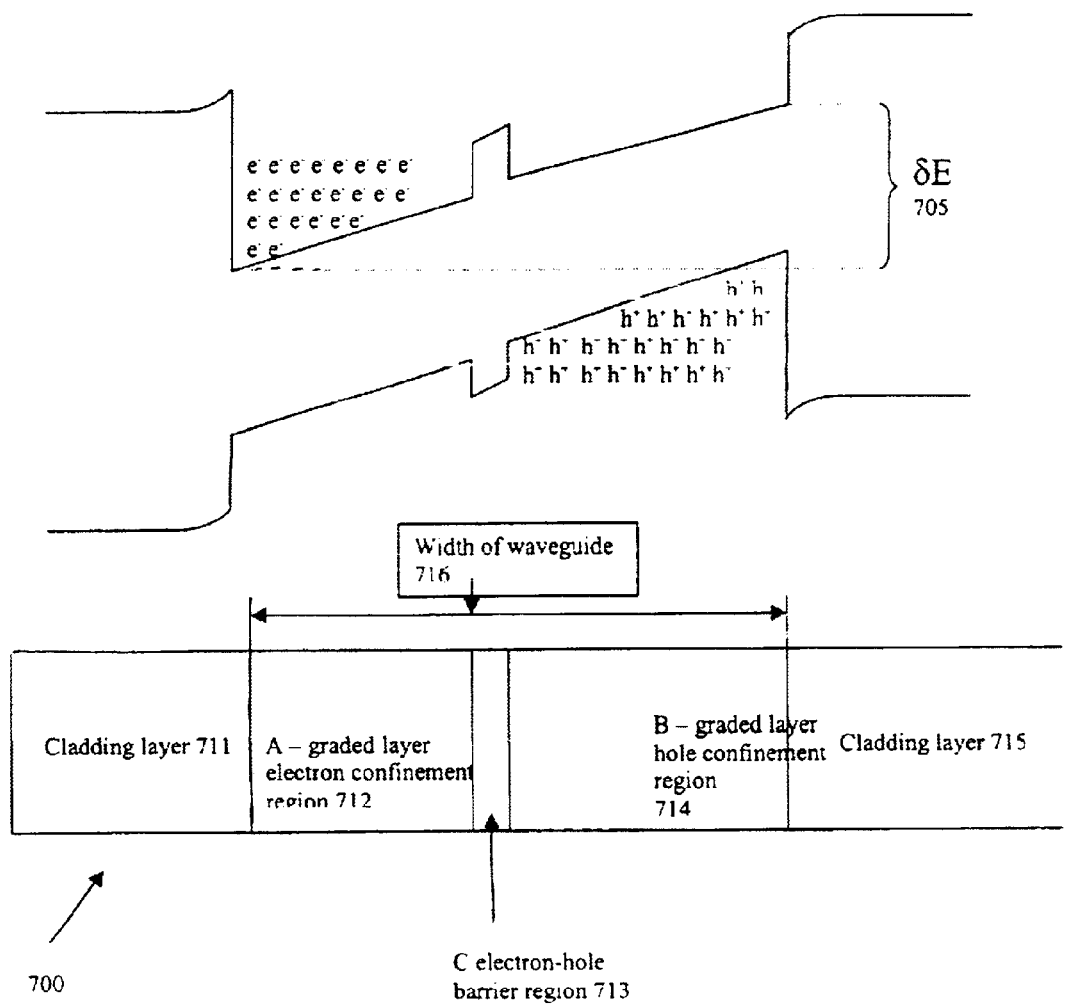
FIG. 20 illustrates an alternate embodiment of the current invention using an intermediate barrier layer to assist in the creation of electron-hole isolation in accordance with the present invention.

FIG. 20 illustrates an alternate embodiment of the current invention using an intermediate barrier layer 713 to assist in the creation of electron-hole isolation. According to alternate embodiments of the current invention, one or more intermediate barrier layers may be used.

For the purposes of illustration, the band structures illustrated in FIGS. 15, 16, 17, 18, 19, and 20 are drawn in proper forward bias conditions. Typically, a DBR may be operated under a forward bias condition for optimal characteristics. In order to simplify the illustrations, neither the bias current nor the detailed band bending that may occur in the cladding layers has been illustrated.

Figure 21:
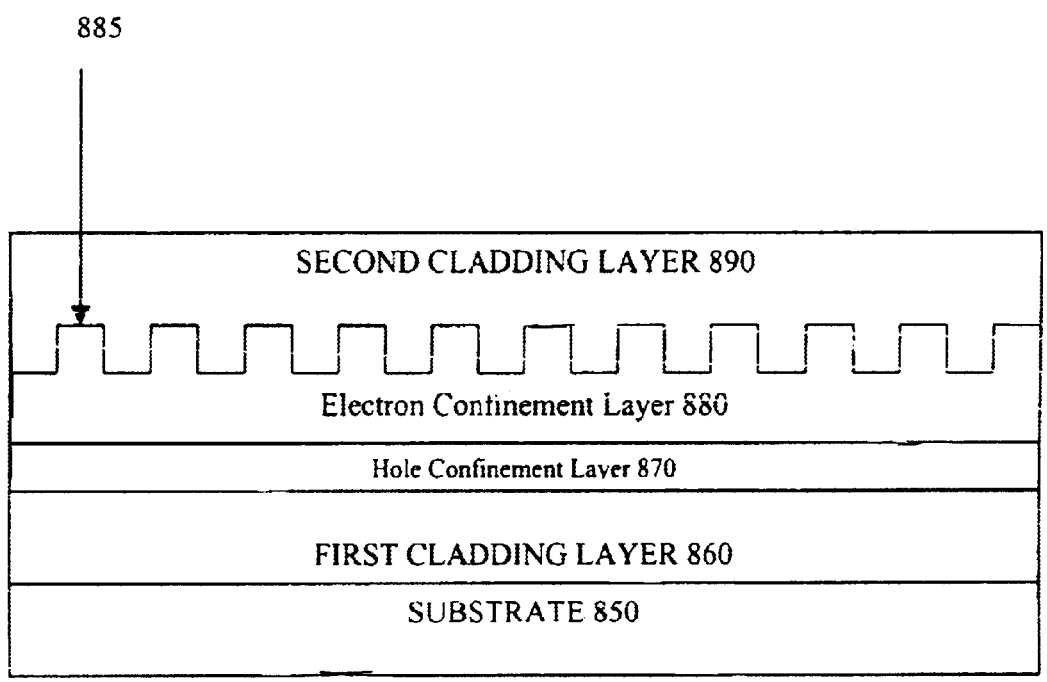
FIG. 21 illustrates a grating layer in a cross sectional view of a typical DBR structure in accordance with the present invention.
Figure 22:
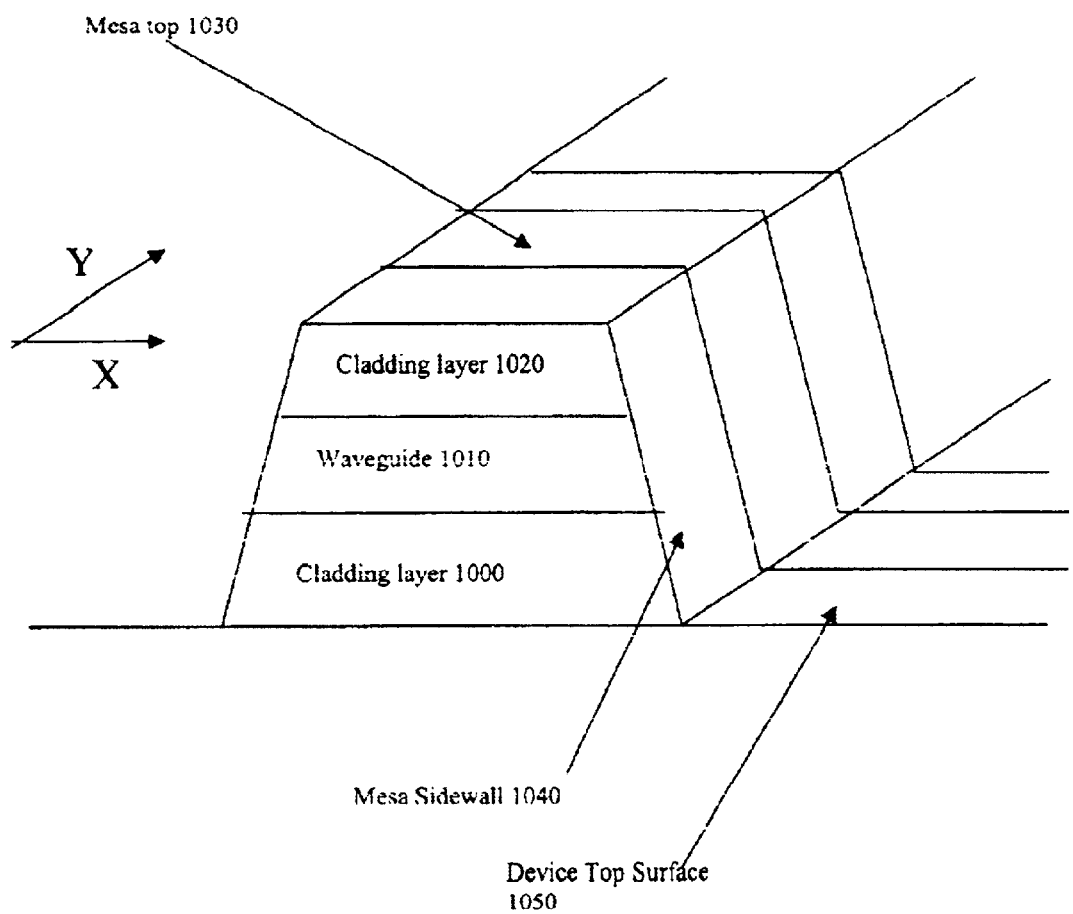
FIG. 22 illustrates an alternate embodiment of the current invention with a grating layer comprised of grooves on the device surface in accordance with the present invention.

Typical DBRs comprise grating layers. For example, FIG. 21 illustrates a grating layer 885 in a cross sectional view of a typical DBR structure. In this example, a grating layer was created at the interface between the uppermost confinement layer 880 and the second cladding layer 890. Typically, a grating layer may be created at the interface between two materials with differing indices of refraction. In this case, the grating layer comprises a ridged interface between layers 880 and 890. In this case, a square profile has been illustrated with a height of 100–200 nm. However, alternate embodiments of the current invention may comprise differing profiles. For example, an alternate embodiment of the current invention may comprise a grating with a sine wave profile. Typically, the period of the grating may be selected according to the wavelength range supported by the DBR. For example, for a DBR operating in the 1.55 μm region, a typical grating period may be approximately 235 nm. Alternate embodiments of the current invention may comprise a grating layer in alternate locations. For example, the grating may be located between the waveguide and the first cladding layer, between adjacent confinement regions in the waveguide, between the waveguide and the second cladding layer or on top of the second cladding layer. FIG. 22 illustrates an alternate embodiment of the current invention with a grating layer comprised of grooves on the device surface. In this example, grooves may be created on the device top surface 1050. In some cases, grooves may be created on the mesa top 1030 and/or mesa sidewalls 1040 instead of or in addition to the top surface grooves. Preferably, a grating layer may be created with holographic patterning techniques. However, alternate techniques may be used to create a grating layer such as e-beam lithography. Preferably, when a grating layer is buried in a DBR structure, such as grating layer 885, subsequent layers, such as 890, may be created using re-growth techniques.

Figure 23:
FIG. 23 is a flow chart illustrating the process for creating a broadly tunable DBR in accordance with the present invention.
Figure 23:
Figure 23:
Figure 23:
Figure 23:

FIG. 23 is a flow chart illustrating a method for creating a broadly tunable DBR. The method begins when the first cladding layer is created, as shown in step 910. Preferably, the first cladding layer is deposited on a substrate using a technique such as MOCVD or MBE. According to an alternate method of the current invention, the first cladding layer may be grown from the substrate material or established using alternate means such as ion implantation of the substrate material. According to the current invention, the first cladding layer may be n-type or p-type. Preferably, the process continues when the waveguide layer is created comprising one or more electron confinement regions and one or more hole confinement regions, as shown in step 920. Typically, this may be achieved by the careful selection of composition profiles for the first cladding layer, waveguide layer and second cladding layer. Preferably, the compositional profile of the DBR may be based on the energy band diagrams of the materials comprising the cladding and confinement layers. According to some DBRs built according to the current invention, a DBR waveguide may be built by growing, depositing or re-growing one or more discrete layers of uniform composition. Alternately, some DBR waveguides built according to the current invention may be built by growing, depositing, re-growing one or more layers of varying composition or by creating one or more layers of uniform composition and then doping, diffusing or implanting additional material to compositional variation. Typical growth techniques may comprise conventional growth techniques such as MBE, CVD and/or MOCVD. In some cases, the process continues when a grating layer is created, as shown in step 930. Preferably, a grating layer may be established by patterning and etching a grating on the top layer of the waveguide using conventional techniques. Preferably, holographic techniques may be used to establish the grating pattern. However, alternate techniques for creating a grating pattern such as e-beam lithography may be used. Subsequent deposition of a material with a differing index of refraction may complete the creation of a grating. Preferably, layers of material created after the creation of the grating layer may be re-grown instead of deposited. However, according to the current invention, subsequent layers may be deposited. Preferably, the material comprising the second cladding layer may provide the source of material with a differing index of refraction. However, according to the current invention, an additional layer of material different from the second cladding layer may be used to provide the source of material with a differing index of refraction. In some cases, the grating layer may be established at an earlier or later step in the process. For example, a grating layer may be established between the first cladding layer and the waveguide, in the waveguide between adjacent confinement regions or on top of the DBR device surface. Preferably, the process continues when the second cladding layer is created, as shown in step 920.

Steps 910, 920, 930, 940 and 950 may be rearranged depending on the design of the broadly tunable distributed Bragg reflector and/or the specific manufacturing processes used. For example, some DBR designs may include an optical waveguide comprising alternating electron confinement layers and hole confinement layers wherein the first layer of the optical waveguide is an electron confinement layer. Alternately, some DBR designs may include an optical waveguide comprising alternating electron confinement layers and hole confinement layers wherein the first layer of the optical waveguide is a hole confinement layer. Alternately, some DBR designs may comprise differing numbers of hole confinement layers and electron confinement layers.

Optionally, one or more additional process steps such as, but not limited to lithography, patterning, deposition, growth, annealing and etching may be incorporated into the process according to the current invention. For example, laser devices, integrated electro-optical devices and/or more complex optical devices may be built by adding conventional processing steps to the preferred method according to the current invention. Optional Step 960 illustrates one example of an additional conventional process step added after the process steps according to a preferred method according to the current invention have been completed. Optionally, alternate methods according to the current invention may incorporate one or more of the additional conventional processing steps between, before and/or after the preferred process steps according to the current invention.

FIGS. 15–23, although the term DBR is used to describe a laser structure, the description is equally applicable to VCSEL and DFB laser structures. In addition, the characterization of the DBR can also be referred to as a carrier reservoir structure, as used in describing FIGS. 1—14.

The foregoing described embodiments of the invention are provided as illustrations and descriptions. They are not intended to limit the invention to precise form described. In particular, the Applicants contemplate that functional implementation of the invention described herein may be implemented equivalently in hardware, software, firmware, or other available functional components or building blocks. Specifically, figures and descriptions show variation of energy band structure and materials composition in two dimensions. However, it is contemplated that the energy band structures and/or materials compositions may vary in three dimensions. Also, the process steps describing the methods may be re-arranged and/or re-ordered. Other variations and embodiments are possible in light of above teachings, and it is thus intended that the scope of invention not be limited by this Detailed Description, but rather by Claims following.

What is claimed is:

1. A process for creating a broadly tunable Distributed Bragg Reflector (DBR) structure with a low spontaneous recombination rate at operating temperatures comprising the steps of:

creating a first cladding layer of a first conductivity type;

creating an optical waveguide disposed on top of said first cladding layer comprising the steps of creating one or more hole confinement regions and creating one or more electron confinement regions wherein energy barriers of greater than the thermal energy, kT, separate adjacent confinement regions;

creating a second cladding layer of a second conductivity type disposed on top of said optical waveguide;

a conduction band energy barrier greater than the thermal energy, kT, is created by establishing an effective conduction band offset between adjacent confinement regions;

a valence band energy barrier greater than the thermal energy, kT, is created by establishing an effective valence band offset between adjacent confinement regions;

the band gap of said first cladding layer and the band gap of said second cladding layer are greater than the effective band gaps of said hole confinement regions;

the band gap of said first cladding layer and the band gap of said second cladding layer are greater than the effective band gaps of said electron confinement regions;

a first cladding layer conduction band energy barrier greater than the thermal energy, kT, is created by establishing an effective conduction band offset between the conduction band of said first cladding layer and the conduction band of the adjacent confinement layer;

a second cladding layer conduction band energy barrier greater than the thermal energy, kT, is created by establishing an effective conduction band offset between the conduction band of said second cladding layer and the conduction band of the adjacent confinement layer;

a first cladding layer valence band energy barrier greater than the thermal energy, kT, is created by establishing an effective valence band offset between the valence band of said first cladding layer and the valence band of the adjacent confinement layer; and a second cladding layer valence band energy barrier greater than the thermal energy, kT, is created by establishing an effective valence band offset between the valence band of said second cladding layer and the valence band of the adjacent confinement layer.

2. The process of claim 1 further comprising the step of creating a grating layer.

3. The process of claim 1 wherein said first cladding layer comprises an n-type cladding layer and said second cladding layer comprises a p-type cladding layer.

4. The process of claim 1 wherein said first cladding layer comprises a p-type cladding layer and said second cladding layer comprises an n-type cladding layer.

5. The process of claim 1 wherein a valence band energy barrier greater than twice the thermal energy, 2 kT, is created by establishing an effective valence band offset between adjacent confinement regions.

6. The process of claim 1 wherein a conduction band energy barrier greater than twice the thermal energy, 2 kT, is created by establishing an effective conduction band offset between adjacent confinement regions.

7. The process of claim 1 wherein a cladding conduction band energy barrier equal to greater than twice the thermal energy, 2 kT, is created by establishing an effective conduction band offset between the conduction band of said first cladding layer and the conduction band of the adjacent confinement layer.

8. The process of claim 1 wherein a cladding conduction band energy barrier equal to greater than twice the thermal energy, 2 kT, is created by establishing an effective conduction band offset between the conduction band of said second cladding layer and the conduction band of an adjacent confinement layer.

9. The process of claim 1 wherein a cladding valence band energy barrier equal to greater than twice the thermal energy, 2 kT, is created by establishing an effective valence band offset between the valence band of said first cladding layer and the valence band of the adjacent confinement layer.

10. The process of claim 1 wherein a cladding valence band energy barrier equal to greater than twice the thermal energy, 2 kT, is created by establishing an effective valence band offset between the valence band of said second cladding layer and the valence band of the adjacent confinement layer.

11. The process of claim 1 wherein the step of creating said broadly tunable DBR comprises creating one or more graded layers.

12. The process of claim 11 wherein said first cladding layer comprises one or more graded layers.

13. The process of claim 11 wherein said second cladding layer comprises one or more graded layers.

14. The process of claim 11 wherein said optical waveguide comprises one or more graded layers.

15. The process of claim 11 wherein said graded layer varies in composition across the thickness of said optical waveguide.

16. The process of claim 11 wherein said graded layer varies in energy band structure across the thickness of said DBR.

17. The process of claim 11 wherein said graded layer varies in composition across the breadth of said DBR.

18. The process of claim 11 wherein said graded layer varies in energy band structure across the breadth of said DBR.

19. The process of claim 1 wherein the thickness of said optical waveguide is selected to support a single optical mode.

20. The process of claim 1 wherein said optical waveguide comprises one electron confinement region and one hole confinement region wherein said electron confinement layer comprises a layer of material of uniform composition and said hole confinement layer comprises a layer of material of uniform composition.

21. The process of claim 1 wherein said optical waveguide comprises one electron confinement region and one hole confinement region wherein said electron confinement layer comprises a layer of material of uniform energy band structure and said hole confinement layer comprises a layer of material of uniform energy band structure.

22. The process of claim 1 wherein adjacent confinement regions comprise layers of lattice matched materials.

23. The process of claim 22 wherein said electron confinement regions comprise InGaAsP material lattice matched to InP and said hole confinement regions comprise InGaAlAs material lattice matched to InP.

24. The process of claim 22 wherein said electron confinement regions comprise InGaAsSb material lattice matched to InP and said hole confinement regions comprise InGaAlAsSb material lattice matched to InP.

25. The process of claim 1 wherein the thickness of said electron confinement regions is greater than the thickness of said hole confinement regions.

26. The process of claim 1 wherein the effective conduction band offset between adjacent confinement regions is greater than the effective valence band offset between adjacent confinement regions.

27. The process of claim 1 further comprising the step of creating one or more graded layers disposed between said optical waveguide and said first cladding layer.

28. The process of claim 1 further comprising the step of creating one or more graded layers disposed between said optical waveguide and said second cladding layer.

29. The process of claim 1 further comprising the step of creating one or more graded layers disposed between adjacent confinement regions.

30. The process of claim 1 further comprising the step of creating one or more additional cladding layers.

31. A process for creating a broadly tunable Distributed Bragg Reflector (DBR) structure with a low spontaneous recombination rate at operating temperatures comprising the steps of:

creating a first cladding layer of a first conductivity type;

creating an optical waveguide disposed on top of said first cladding layer comprising the steps of creating one or more hole confinement regions and creating one or more electron confinement regions wherein energy barriers of greater than the thermal energy, kT, separate adjacent confinement regions; and creating a second cladding layer of a second conductivity type disposed on top of said optical waveguide;

wherein said energy barriers are created by band gap tilting wherein:

said optical waveguide comprises a layer of graded material wherein the energy level of the lowest conduction band of said waveguide increases across the thickness of said waveguide, the energy level of the highest valence band of said waveguide increases across the thickness of said waveguide and the energy band gap of said waveguide varies across the thickness of said waveguide;

the changes in said energy levels creates an electron confinement region in said optical waveguide comprising a region wherein said energy level of the lowest conduction band and the adjacent cladding layer forms a local minimum in the conduction band;

the changes in said energy levels creates a hole confinement region in said optical waveguide comprising a region wherein said energy level of the highest valence band and the adjacent cladding layer forms a local maximum in the valence band;

the average band gap of said optical waveguide is greater than or equal to the carrier concentration in said optical waveguide divided by twice the thickness of said optical waveguide.

32. The process of claim 31 wherein:

said optical waveguide comprises one or more layers of material wherein the energy band structure varies across the breadth of said waveguide.

33. The process of claim 31 wherein said conduction band and said valence band of said graded layer comprise sloped, stepped or curved profiles across the thickness of said optical waveguide.

34. The process of claim 31 wherein the materials composition of said graded layer comprise sloped, stepped or curved profiles across the thickness of said optical waveguide.

35. The process of claim 31 wherein said conduction band and said valence band of said graded layer comprise sloped, stepped or curved profiles across the breadth of said optical waveguide.

36. The process of claim 31 wherein the materials composition of said graded layer comprise sloped, stepped or curved profiles across the breadth of said optical waveguide.

* * * * *